(12) United States Patent
Kambegawa

(10) Patent No.: US 9,773,532 B2
(45) Date of Patent: Sep. 26, 2017

(54) UPDATING A REFRESH PERIOD AND AN UPDATE PERIOD IN A WIDEIO DEVICE STACKED ON A SYSTEM ON A CHIP

(71) Applicant: CANON KABUSHIKI KAISHA, Tokyo (JP)

(72) Inventor: Minoru Kambegawa, Abiko (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 113 days.

(21) Appl. No.: 14/895,193

(22) PCT Filed: Aug. 1, 2014

(86) PCT No.: PCT/JP2014/070955
§ 371 (c)(1),
(2) Date: Dec. 1, 2015

(87) PCT Pub. No.: WO2015/025732
PCT Pub. Date: Feb. 26, 2015

(65) Prior Publication Data
US 2016/0125921 A1    May 5, 2016

(30) Foreign Application Priority Data
Aug. 20, 2013    (JP) ................................. 2013-170822

(51) Int. Cl.
*G11C 7/04*    (2006.01)
*G11C 11/406*    (2006.01)
(Continued)

(52) U.S. Cl.
CPC ........ *G11C 7/1075* (2013.01); *G06F 11/0733* (2013.01); *G06F 12/06* (2013.01);
(Continued)

(58) Field of Classification Search
CPC ....... G11C 7/04; G11C 7/1072; G11C 11/406; G11C 11/40626; G06F 3/0625;
(Continued)

(56) References Cited

U.S. PATENT DOCUMENTS 7,233,538 B1 * 6/2007 Wu ........................ G11C 11/406
365/222
2010/0201432 A1    8/2010 Sugaya et al.
(Continued)

FOREIGN PATENT DOCUMENTS

WO    2014/073584 A1    5/2014
WO    2014/084150 A1    6/2014

OTHER PUBLICATIONS

International Search Report and Written Opinion of the International Searching Authority mailed Oct. 21, 2014 in PCT/JP2014/070955.

*Primary Examiner* — Hal Schnee
(74) *Attorney, Agent, or Firm* — Fitzpatrick, Cella, Harper & Scinto

(57) ABSTRACT

An information processing apparatus, equipped with a WideIO memory device stacked on an SOC die including a CPU, and a method of controlling the same, are provide. The apparatus obtains temperature information of each of a plurality of memories of the WideIO memory device, and generates temperature distribution information of the WideIO memory device in accordance with respective execution of a plurality of function modules. Then, the apparatus determines a refresh rate of the WideIO memory device based on the maximum temperature of the WideIO memory device, decides a period, at which the refresh rate is determined, based on an operation mode of the information processing apparatus and a change rate of the maximum temperature for a predetermined time interval, and refreshes (Continued)

the WideIO memory device in accordance with the determined refresh rate.

11 Claims, 18 Drawing Sheets

(51) Int. Cl.
    *G06F 11/07*     (2006.01)
    *G06F 12/06*     (2006.01)
    *G11C 7/10*     (2006.01)

(52) U.S. Cl.
    CPC .............. *G11C 7/04* (2013.01); *G11C 7/1072* (2013.01); *G11C 11/406* (2013.01); *G11C 11/40626* (2013.01)

(58) Field of Classification Search
    CPC .... G06F 3/0619; G06F 11/07; G06F 11/0703; G06F 11/0706; G06F 11/0733; G06F 12/02; G06F 12/0207; G06F 12/06
    See application file for complete search history.

(56) References Cited

U.S. PATENT DOCUMENTS

| | | |
|---|---|---|
| 2011/0205826 A1 | 8/2011 | Kuroda |
| 2012/0018885 A1 | 1/2012 | Lee et al. |
| 2013/0007357 A1 | 1/2013 | Isaac et al. |
| 2013/0114364 A1 | 5/2013 | Sakakibara et al. |
| 2013/0169347 A1 | 7/2013 | Kim et al. |
| 2014/0108841 A1 | 4/2014 | Tomi |
| 2014/0140156 A1* | 5/2014 | Shoemaker ............ G11C 7/04 365/201 |
| 2014/0281311 A1* | 9/2014 | Walker ................ G06F 3/0631 711/162 |

* cited by examiner

FIG. 7A

| SDRAM 301 REGION A | SDRAM 302 REGION B |
|---|---|
| SDRAM 304 REGION D | SDRAM 303 REGION C |

FIG. 7B

| A1 | A2 | A3 | B1 | B2 | B3 |
|---|---|---|---|---|---|
| A4 | A5 | A6 | B4 | B5 | B6 |
| A7 | A8 | A9 | B7 | B8 | B9 |
| D1 | D2 | D3 | C1 | C2 | C3 |
| D4 | D5 | D6 | C4 | C5 | C6 |
| D7 | D8 | D9 | C7 | C8 | C9 |

FIG. 8

| REGION | FUNCTIONAL BLOCK | HEAT GENERATION AMOUNT |
|---|---|---|
| A1 | RIP 111 | 2 |
| A2 | DISPLAY CONTROLLER 402 | 1 |
| A3 | SATA CONTROLLER 404 | 1 |
| A4 | RIP 111 | 3 |
| A5 | RIP 111 | 2 |
| A6 | CPU 101 | 1 |
| A7 | RIP 111 | 2 |
| A8 | EDITING IMAGE PROCESSING UNIT 108 | 2 |
| A9 | WideIO CONTROLLER 112 | 2 |
| B1 | CPU 101 | 2 |
| B2 | CPU 101 | 2 |
| B3 | MODEM 104 | 1 |
| B4 | CPU 101 | 3 |
| B5 | CPU 101 | 3 |
| B6 | NETWORK I/F 103 | 2 |
| B7 | WideIO CONTROLLER 112 | 2 |
| B8 | PRINT IMAGE PROCESSING UNIT 109 | 2 |
| B9 | NETWORK I/F 103 | 1 |
| C1 | PRINT IMAGE PROCESSING UNIT 109 | 2 |
| C2 | PRINT IMAGE PROCESSING UNIT 109 | 3 |
| C3 | FlashROM CONTROLLER 406 | 1 |
| C4 | PRINT IMAGE PROCESSING UNIT 109 | 3 |
| C5 | PRINT IMAGE PROCESSING UNIT 109 | 2 |
| C6 | PRINT IMAGE PROCESSING UNIT 109 | 1 |
| C7 | PRINTER I/F 408 | 1 |
| C8 | PRINTER I/F 408 | 1 |
| C9 | PRINTER I/F 408 | 1 |
| D1 | RIP 111 | 1 |
| D2 | EDITING IMAGE PROCESSING UNIT 108 | 2 |
| D3 | SCAN IMAGE PROCESSING UNIT 110 | 2 |
| D4 | SCANNER I/F 407 | 1 |
| D5 | SCAN IMAGE PROCESSING UNIT 110 | 3 |
| D6 | SCAN IMAGE PROCESSING UNIT 110 | 2 |
| D7 | SCANNER I/F 407 | 1 |
| D8 | SCANNER I/F 407 | 1 |
| D9 | SCAN IMAGE PROCESSING UNIT 110 | 1 |

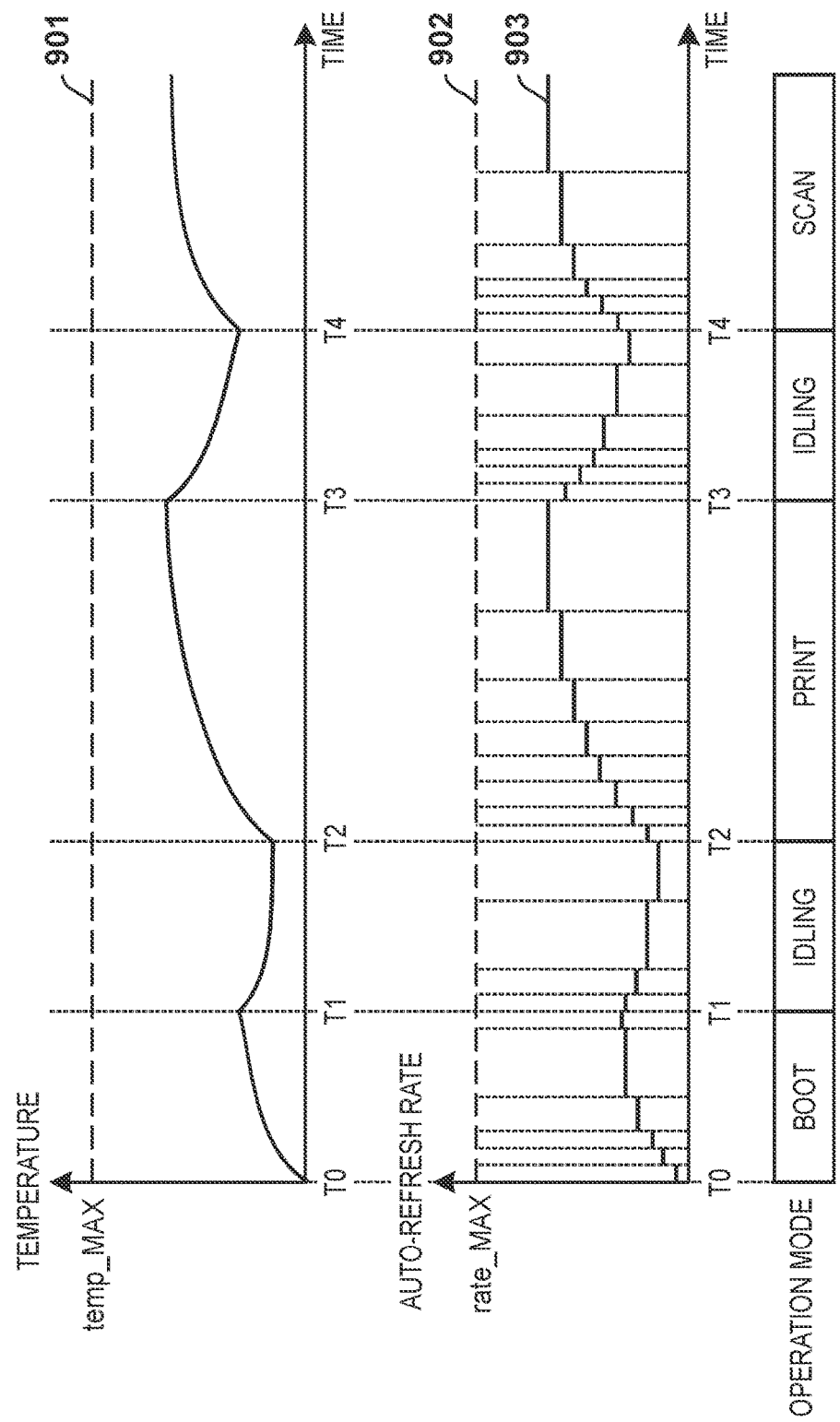

FIG. 13

| REGION | SENSOR (1300) | TEMPERATURE PRIOR TO CORRECTION (1301) | CORRECTED TEMPERATURE (1302) |
|---|---|---|---|
| A1 |  | 48 | 48 |
| A2 |  | 51 | 51 |
| A3 |  | 53 | 53 |
| A4 |  | 50 | 50 |
| A5 | 53 | 53 | 53 |
| A6 |  | 55 | 55 |
| A7 |  | 50 | 50 |
| A8 |  | 53 | 53 |
| A9 |  | 55 | 55 |
| B1 |  | 54 | 55 |
| B2 |  | 52 | 53 |
| B3 |  | 50 | 51 |
| B4 |  | 55 | 56 |
| B5 | 55 | 54 | 55 |
| B6 |  | 52 | 53 |
| B7 |  | 53 | 54 |
| B8 |  | 53 | 54 |
| B9 |  | 52 | 53 |
| C1 |  | 54 | 54 |
| C2 |  | 54 | 54 |
| C3 |  | 52 | 52 |
| C4 |  | 57 | 57 |
| C5 | 55 | 55 | 55 |
| C6 |  | 53 | 53 |
| C7 |  | 54 | 54 |
| C8 |  | 52 | 52 |
| C9 |  | 50 | 50 |
| D1 |  | 51 | 50 |
| D2 |  | 53 | 52 |
| D3 |  | 55 | 54 |
| D4 |  | 53 | 52 |
| D5 | 54 | 55 | 54 |
| D6 |  | 57 | 56 |
| D7 |  | 51 | 50 |
| D8 |  | 53 | 52 |
| D9 |  | 55 | 54 |

| INDEX 1401 | TEMPERATURE RANGE (°C) 1402 | REFRESH RATE (μ sec) 1403 |
|---|---|---|
| 0 | 0~2 | 409 |
| 1 | 2~4 | 372 |
| ⋮ | ⋮ | ⋮ |
| 20 | 40~42 | 62 |
| 21 | 42~44 | 56 |
| 22 | 44~46 | 40 |
| 23 | 46~48 | 46 |
| 24 | 48~50 | 42 |
| 25 | 50~52 | 38 |
| 26 | 52~54 | 35 |
| 27 | 54~56 | 32 |
| 28 | 56~58 | 29 |
| 29 | 58~60 | 26 |
| ⋮ | ⋮ | ⋮ |
| 40 | 80~82 | 9.4 |
| 41 | 82~84 | 8.6 |
| 42 | 84~86 | 7.8 |

| | 1701 | 1702 | 1703 |
|---|---|---|---|
| | INDEX | TEMPERATURE CHANGE RATE (°C/μ sec) | UPDATING PERIOD IN PRINT MODE |
| | 0 | 0~10 | 50 |
| | 1 | 10~20 | 70 |
| | 2 | 20~30 | 40 |
| | 3 | 40~50 | 35 |
| | 4 | 60~70 | 30 |
| | 5 | 80~90 | 25 |
| | 6 | 100~110 | 20 |
| | 7 | 110~120 | 15 |
| | ⋮ | ⋮ | ⋮ |

FIG. 17A

| | 1711 | 1712 | 1713 |
|---|---|---|---|
| | INDEX | TEMPERATURE CHANGE RATE (°C/μ sec) | UPDATING PERIOD IN SCAN MODE |
| | 0 | 0~10 | 60 |
| | 1 | 10~20 | 36 |
| | 2 | 20~30 | 73 |
| | 3 | 40~50 | 42 |
| | 4 | 60~70 | 36 |
| | 5 | 80~90 | 30 |
| | 6 | 100~110 | 24 |
| | 7 | 110~120 | 18 |
| | ⋮ | ⋮ | ⋮ |

FIG. 17B

| | 1721 | 1722 | 1723 |
|---|---|---|---|
| | INDEX | TEMPERATURE CHANGE RATE (°C/μ sec) | UPDATING PERIOD IN BOOT MODE |
| | 0 | 0~10 | 80 |
| | 1 | 10~20 | 72 |
| | 2 | 20~30 | 56 |
| | 3 | 40~50 | 56 |
| | 4 | 60~70 | 48 |
| | 5 | 80~90 | 40 |
| | 6 | 100~110 | 32 |
| | 7 | 110~120 | 24 |
| | ⋮ | ⋮ | ⋮ |

FIG. 17C

| | 1731 | 1732 | 1733 |
|---|---|---|---|
| | INDEX | TEMPERATURE CHANGE RATE (°C/μ sec) | UPDATING PERIOD IN IDLING MODE |
| | 0 | 0~10 | 100 |
| | 1 | 10~20 | 90 |
| | 2 | 20~30 | 80 |
| | 3 | 40~50 | 70 |
| | 4 | 60~70 | 60 |
| | 5 | 80~90 | 50 |
| | 6 | 100~110 | 40 |
| | 7 | 110~120 | 30 |
| | ⋮ | ⋮ | ⋮ |

FIG. 17D

| TIME | TEMPERATURE CHANGE Δt(°C) | UPDATING PERIOD (msec) | Period(i)=(2/Δt)×Period(i-1) |
|---|---|---|---|
| t0 | — | 10 | Period(0)=10, PREDETERMINED PERIOD |
| t1 | 2.0 | 10 | 2/2×10 |
| t2 | 1.0 | 20 | 2/1×10 |
| t3 | 1.5 | 26.7 | 2/1.5×20 |

| TRANSITION OF OPERATION MODE | PREDETERMINED PERIOD (msec) |
|---|---|
| OFF ⇔ BOOT | 20 |
| BOOT ⇔ IDLING | 20 |
| IDLING ⇔ PRINT | 10 |
| IDLING ⇔ SCAN | 15 | ic # UPDATING A REFRESH PERIOD AND AN UPDATE PERIOD IN A WIDEIO DEVICE STACKED ON A SYSTEM ON A CHIP

TECHNICAL FIELD

The present invention relates to an information processing apparatus equipped with a WideIO memory device stacked on an SOC (System On a Chip) die including a CPU, a method of controlling the same, a program for the same, and a storage medium.

BACKGROUND ART

There are many information processing apparatuses comprising a CPU, such as a microprocessor, that use a DRAM (Dynamic Random Access Memory) for saving of data for executing an OS, various applications, or the like, for temporary storage of data for executing image processing, or the like. The DRAM is connected to a CPU, an SOC (System On a Chip), or the like, and used. Also, in recent years, accompanying an increase in the number of functions and an increase in the sophistication of functions of information processing apparatuses, a memory bandwidth of DRAM is increasing, and in order to increase the memory bandwidth, a frequency of a clock for when a memory is accessed is made to be higher in standards such as DDR (Double-Data-Rate) 3, DDR4, or the like. In addition, the memory bandwidth is ensured by arranging a plurality of DRAM channels connected to a CPU, an ASIC (Application Specific Integrated Circuit), or the like. However, when an increase in the frequency of a clock, or when a plurality of memory channels are employed, a new problem of electric power consumption increasing occurs.

So, WideIO, which is a next generation DRAM standard, has currently been receiving attention. Regarding WideIO, a 3D stacking technique with a TSV (Through Silicon Via) is used, and configuration is taken layering DRAM chips on an SOC die. A characteristic of WideIO is that a high bandwidth of a maximum of 12.8 GB/second or more can be obtained with a 512 bit of wide data width, and also the WideIO has low-power consumption because an access frequency is kept low. Also, by employing the TSV, a package size can be made to be thinner and smaller compared to a conventional PoP (Package on Package). Furthermore, as a countermeasure to heat due to stacking memory in the SOC package, a temperature sensor, for detecting a temperature of the memory, is built in, and a self-refresh rate is changed in accordance with the detected temperature. Also, configuration may be taken so that a data width of 512 bits is divided into four channels of 128 bits each, and each channel can be controlled independently. For example, usage in which a channel 1 and a channel 2 are put into a self-refresh state, and a channel 3 and a channel 4 are used for normal memory access is possible. A basic configuration, a basic access approach, and the like, for WideIO are recited in US Patent Application Publication No. 2012/0018885 A1.

For DRAM, storage of data is performed by accumulating an electric charge in a capacitor equipped in each cell, and because these capacitors discharge due to a leak current of a semiconductor, it is necessary to charge the capacitor by a refresh operation in order to hold the data in the DRAM. Because this discharge of electric charge depends on the temperature, and the higher the temperature, the faster the discharge speed becomes, it is necessary to enhance the refresh rate when the temperature of the DRAM becomes higher.

In conventional memory access control approaches, the auto-refresh rate set for a memory controller is set in accordance with a maximum temperature that the DRAM reaches. For this reason, in a case where the temperature of the DRAM is low, there is room to set the auto-refresh rate to be lower, and suppress electric power consumption to improve access performance.

In order to decide an appropriate auto-refresh rate, the temperature of a position (hereinafter referred to as a hotspot) where the temperature has become highest on the DRAM chip may be detected in real-time, and a sufficient auto-refresh rate for that temperature may be set. However, there are the following issues.

The first issue is being able to obtain the temperature of the hotspot precisely. Because hotspots in a stacked DRAM chip occur more markedly than in conventional type chips, it is known that temperature differences between a hotspot and a non-hotspot become large. Thus, in a case where the previously described temperature sensor, for example, is positioned in a non-hotspot, a large discrepancy between the temperature that the sensor detects and the temperature of the hotspot occurs. As a result, a correction of the auto-refresh rate based on the temperature measured by a temperature sensor is not performed correctly, and this leads to an increase in electric power consumption, a disappearance of content stored in the DRAM, or the like.

A second issue is that processing for detecting the temperature of a hotspot in real-time and setting the auto-refresh rate corresponding to the detected temperature becomes overhead.

SUMMARY OF INVENTION

An aspect of the present invention is to eliminate the above-mentioned problems which are found in the conventional technology.

A feature of the present invention is to provide a technique in which it is possible to widen a bandwidth of stacked DRAM by performing a setting of a refresh rate in accordance with a temperature of the DRAM.

According to an aspect of the present invention, there is provided an information processing apparatus equipped with a WideIO memory device stacked on an SOC die including a CPU, comprising: temperature obtaining means for acquiring temperature information of each of a plurality of memories of the WideIO memory device; a plurality of functional modules, included in the SOC die, for executing respective functions; generation means for generating temperature distribution information of the WideIO memory device in accordance with respective execution of the plurality of functional modules; determination means for obtaining a maximum temperature of the WideIO memory device based on the temperature distribution information and determining a refresh rate of the WideIO memory device based on the maximum temperature; updating period decision means for deciding a period, at which the determination means determines the refresh rate of the WideIO memory device, based on an operation mode of the information processing apparatus and a change rate of the maximum temperature for a predetermined time interval; and memory control means for refreshing the WideIO memory device in accordance with the refresh rate determined by the determination means at the period determined by the updating period decision means.

Further features of the present invention will become apparent from the following description of exemplary embodiments with reference to the attached drawings.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 7A depict a view for representing each SDRAM device comprised in the WideIO-SDRAM.

FIG. 7B depicts a view illustrating a positional relationship of 6×6 regions into which the SOC die is divided equally into according to the first embodiment.

FIG. 8 depicts a view for explaining a table that represents regions shown in FIG. 7B of the SOC die to which functions of the MFP are allocated, and amount of heat generation when the regions are activated in relative values according to the first embodiment.

FIG. 9 depicts a view for explaining states of updating an auto-refresh rate in accordance with changes of the temperature of a hotspot of the WideIO-SDRAM in the MFP according to the first embodiment.

FIG. 13 depicts a view for explaining a concrete example of correcting temperature distribution information using temperature information obtained by the temperature sensors in the first embodiment.

FIGS. 17A through 17D depict views for illustrating examples of relationships between temperature change rate and updating period for each operation mode.

DESCRIPTION OF EMBODIMENTS

Embodiments of the present invention will be described hereinafter in detail, with reference to the accompanying drawings. It is to be understood that the following embodiments are not intended to limit the claims of the present invention, and that not all of the combinations of the aspects that are described according to the following embodiments are necessarily required with respect to the means to solve the problems according to the present invention. Note, explanation will be given with an example of an MFP (a digital multi-function peripheral) comprising a plurality functions such as scanning, printing, copying, and the like, as an information processing apparatus equipped with WideIO according to this embodiment.

First Embodiment

Figure 1:
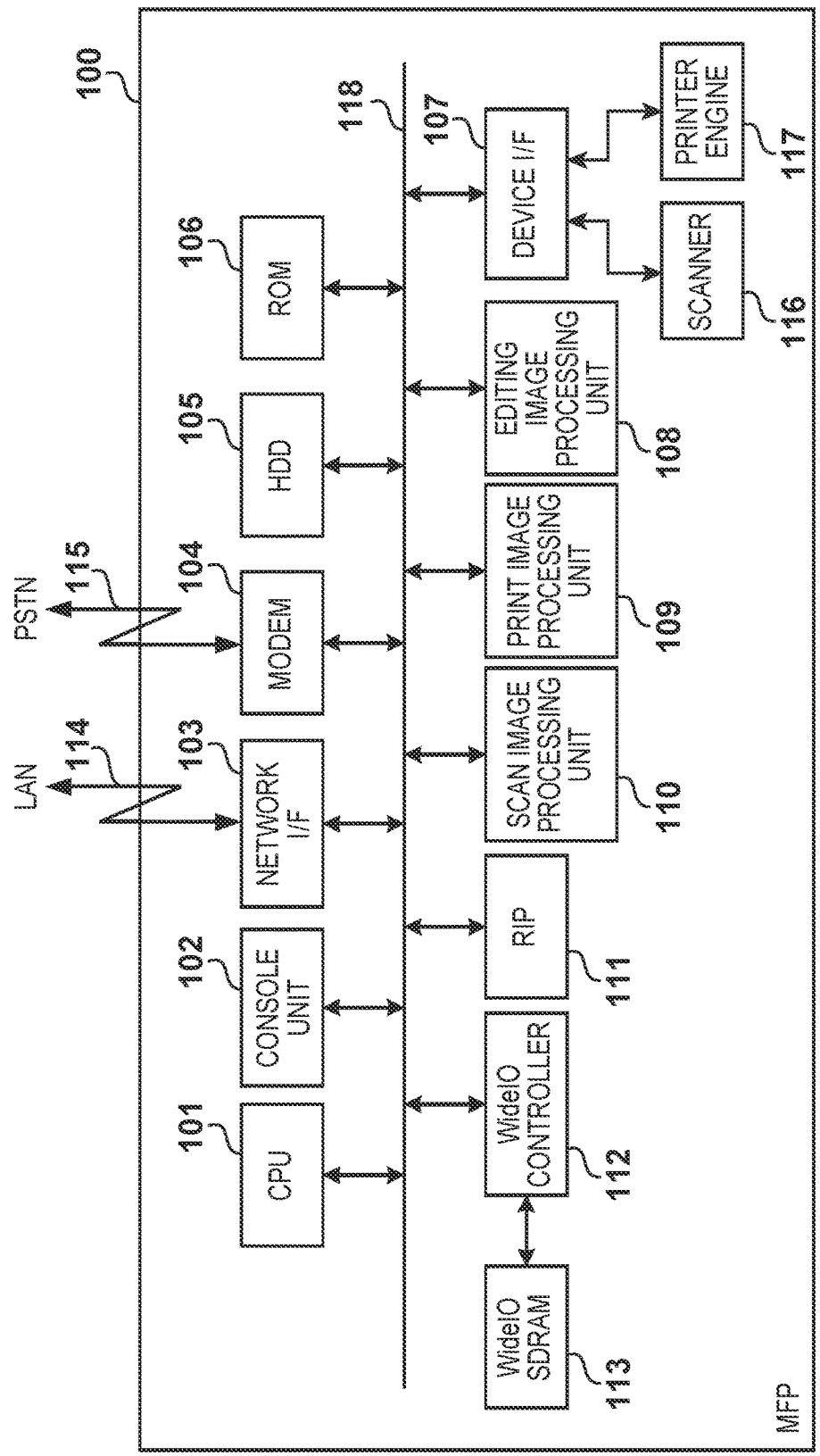
FIG. 1 is a block diagram for showing an overall configuration of an MFP (a digital multi-function peripheral) according to a first embodiment.

FIG. 1 is a block diagram for showing an overall configuration of an MFP (a digital multi-function peripheral) 100 according to a first embodiment.

The MFP 100 has a scanner 116, which is an image input device, and a printer engine 117, which is an image output device, and these devices are connected to a system bus 118 via a device interface (I/F) 107. Under the control of a CPU 101, scanning of an image of an original by the scanner 116, and printing by the printer engine 117 are possible. Also, the MFP 100 is connected to a LAN 114 and a public switched telephone network (PSTN) 115, and through these, input and output of device information, image data, or the like, with an external device connected to the LAN or the public switched telephone network, can be performed.

The CPU 101 controls operation of the MFP 100 by executing a program loaded into a WideIO-SDRAM 113 from an HDD 105 by a boot program stored in a ROM 106. A console unit 102 has an input unit, a display unit, or the like, such as a keyboard, a touch panel, or the like, receives an instruction from a user, and also displays such things as a message, a result of processing, or the like, to a user with the display unit. A network I/F 103 is realized by a LAN card, for example, or the like, and performs input and output of device information, image data, and the like, with an external device via the LAN 114. A modem 104 performs input and output of control information, image data, or the like, with an external device via the public switched telephone network 115. The HDD 105 is a hard disk drive, and stores an OS, various application programs, or the like, and is also used to store input image data, or the like. The ROM 106 stores a boot program, various data, or the like. The device I/F 107 connects the scanner 116 and the printer engine 117, and performs image data transfer processing between the scanner 116 or the printer engine 117, and the system bus 118.

An editing image processing unit 108 performs various image processing such as image data rotation, scaling, or the like, color processing, trimming/masking, binarization, multi-value conversion, blank sheet determination, or the like. A print image processing unit 109 performs image processing in accordance with the printer engine 117 on image data output to the printer engine 117. A scan image processing unit 110 performs various processing such as correction, processing, editing, or the like, on image data input from the scanner 116. An RIP (raster image processor) 111 renders page description language (PDL) code into image data. A WideIO controller 112 converts a memory access command from the CPU 101, various image processing units, or the like, for example, into a command that the WideIO-SDRAM 113 is able to interpret and accesses the WideIO-SDRAM 113. The WideIO-SDRAM 113 stores programs executed by the CPU 101, and also provides a system work memory for the CPU 101 to operate. Also, the WideIO-SDRAM 113 is used as an image memory for temporarily storing input image data. The system bus 118 connects the above described units and the CPU 101, and transfers control signals, data, or the like.

Figure 2A:
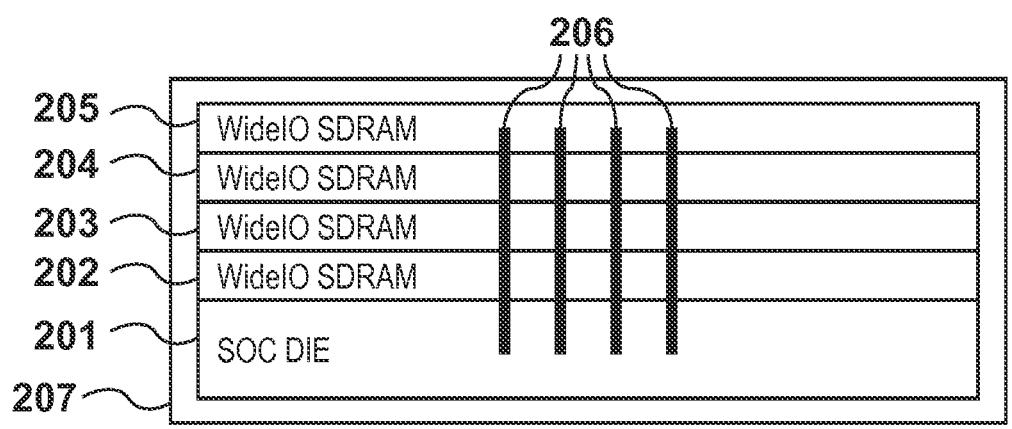
FIGS. 2A and 2B depict views illustrating a configuration of a WideIO-SDRAM (Synchronous Dynamic Random Access Memory) according to the first embodiment.
Figure 2B:
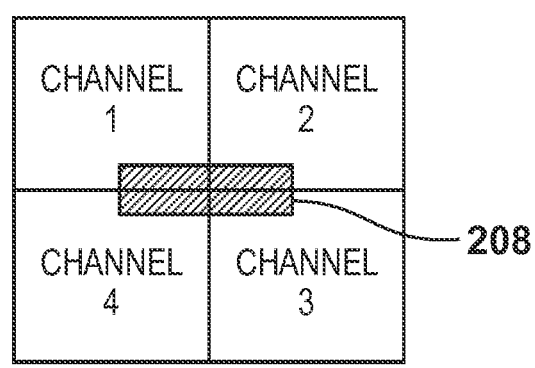

FIGS. 2A and 2B depicts view illustrating a configuration of the WideIO-SDRAM 113 according to the first embodiment, and FIG. 2A depicts a side view from the perspective of lateral faces of the WideIO-SDRAM and the SOC die, while FIG. 2B depicts a top view from the perspective of a top side.

An SOC die 201 is, for example, equipped with the CPU 101, the device I/F 107, the RIP 111, and the image processing units 108-110 in the first embodiment. WideIO-SDRAMs 202-205 are stacked on the SOC die 201, and are connected with the SOC die 201 by through-silicon vias (TSV (Through Silicon Via)) 206. The WideIO-SDRAMs can be stacked until a maximum of four layers in accordance with a required memory capacity, and FIG. 2A shows an example in which four layers are stacked. In the first embodiment, the WideIO-SDRAMs 202-205 are assumed to be configured by stacking on each of channels 1-4 of FIG. 2B. An SOC package 207 contains the SOC die 201 and the WideIO-SDRAMs 202-205 in a single package. A WideIO-SDRAM I/F 208 is arranged in a central portion of the SOC die 201 and the WideIO-SDRAMs 202-205 as shown in FIG. 2B.

Figure 3:
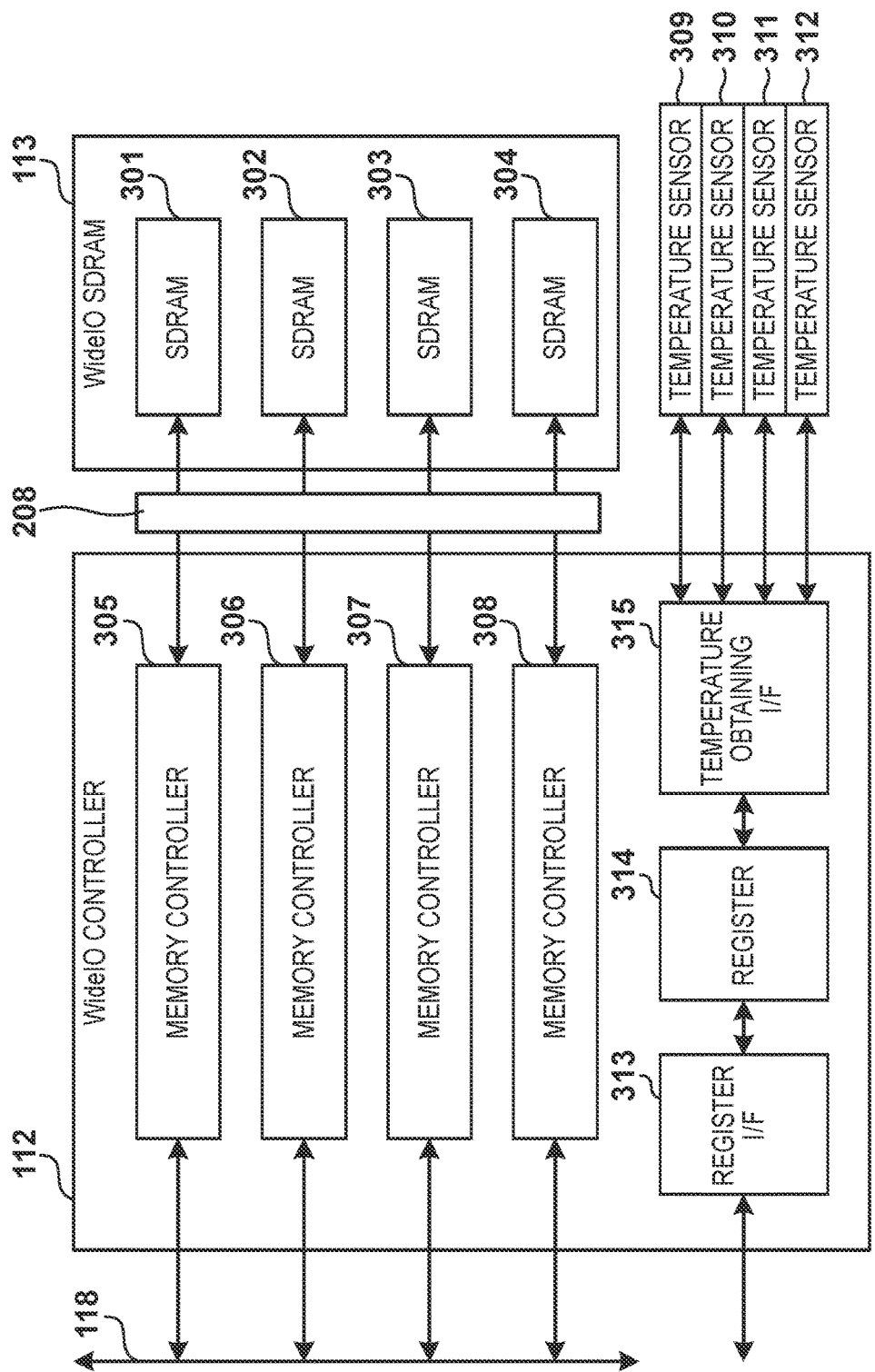
FIG. 3 is a block diagram for showing an internal configuration of a WideIO controller according to the first embodiment.

FIG. 3 is a block diagram for showing an internal configuration of the WideIO controller 112 according to the first embodiment.

In FIG. 3, the WideIO controller 112 is connected to between the system bus 118 and the WideIO-SDRAM 113 as shown in FIG. 1. Furthermore, the WideIO controller 112 is connected to temperature sensors 309-312 (not shown in FIG. 1).

SDRAMs 301-304 are four memories arranged in the WideIO-SDRAM 113, and, as shown graphically, each is equipped with a dedicated interface. These dedicated interfaces correspond to four channels of the WideIO-SDRAMs 202-205 stacked on the SOC die 201 as explained above, and the dedicated interfaces correspond to the WideIO-SDRAM I/F 208 of FIG. 2B. Each of memory controllers 305-308 converts a memory access command from the system bus 118 into a command that a respective connected corresponding SDRAM is able to interpret. The temperature sensors 309-312 measure temperatures of respective corresponding SDRAMs in the SDRAMs 301-304.

A register I/F 313 receives an access from the CPU 101 via a register dedicated bus (not shown). A register 314 includes multiple registers and stores various temperature information that a temperature obtaining I/F 315 obtains from the temperature sensors 309-312, setting information of each operation mode of the memory controllers 305-308 set from the CPU 101, or the like. The temperature obtaining I/F 315 obtains temperature information by dispatching a command for acquiring temperature information from a temperature sensor designated by a later explained temperature sensor designation register 501 (FIG. 5) when a temperature information obtaining request from a later explained temperature information storage register 502 (FIG. 5) is detected. In this way, obtained temperature information is stored in the later explained temperature information storage register 502.

Figure 4:
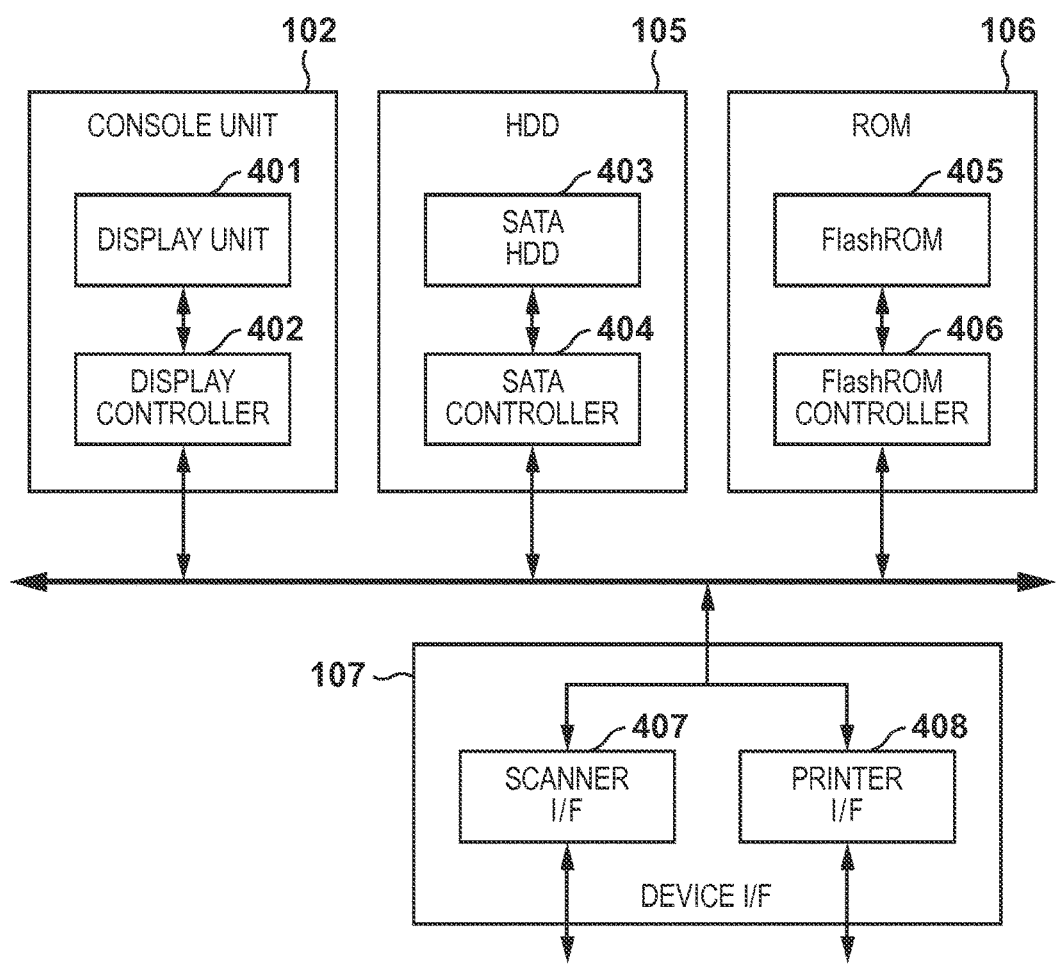
FIG. 4 is a block diagram for explaining a configuration of a console unit, an HDD, a ROM, an external I/F controller including a device I/F of the MFP and an external device according to embodiments.

FIG. 4 is a block diagram for explaining a configuration of the console unit 102, the HDD 105, the ROM 106, and the external I/F controller including the device I/F 107 of the MFP 100 and the external device according to embodiments.

In the console unit 102, in the HDD 105 and in the ROM 106 are respectively included a display controller 402, an SATA controller 404, and a FlashROM controller 406, which are various general-purpose I/F controllers. Similarly a display unit 401, an SATA HDD 403, and a FlashROM 405, which are general-purpose devices controlled by the above general-purpose I/F controllers, are included. Also, in the device I/F 107 are included a scanner I/F 407 and a printer I/F 408, which receive control signals, image data, or the like, from each device of the scanner 116 and the printer engine 117.

Figure 5:
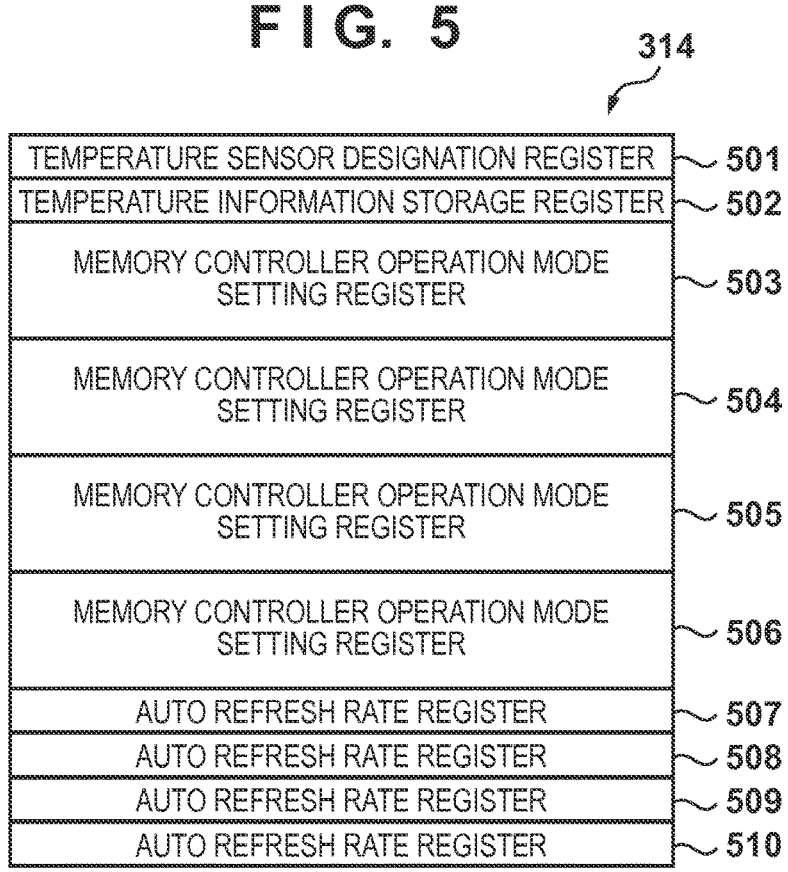
FIG. 5 depicts a view for explaining a configuration of registers according to the first embodiment.

FIG. 5 depicts a view for explaining a configuration of the register 314 according to the first embodiment.

The register 314 comprise the temperature sensor designation register 501, the temperature information storage register 502, memory controller operation mode setting registers 503-506, and auto refresh rate registers 507-510. The temperature sensor designation register 501 is a register for storing information for specifying a target temperature sensor in a case where the CPU 101 wishes to obtain temperature information of the target temperature sensor. Because in the first embodiment, explanation is given using an example comprising four temperature sensors, the temperature sensor designation register 501 is comprised of a 2-bit register, and is able to identify each of the four temperature sensors by each of the states of the 2 bits. The temperature information storage register 502 makes a request to the temperature obtaining I/F 315 in order to obtain temperature information of the temperature sensor designated by the temperature sensor designation register 501 when an obtaining request for temperature information is input from the CPU 101. Then, the temperature information storage register 502 stores temperature information obtained from the temperature obtaining I/F 315, and outputs the temperature information that the temperature information storage register 502 stores in accordance with a temperature information read request from the CPU 101.

Each of the memory controller operation mode setting registers 503-506 is a register for setting an operation mode of one of the memory controllers 305-308, and a setting value relating to a memory control of each SDRAM is stored in each of the memory controller operation mode setting registers 503-506. Here, a timing parameter related to memory access, for example, is an example of the setting value related to memory control here. Note, the memory controller operation mode setting register 503 sets the operation mode of the memory controller 305, and the memory controller operation mode setting register 504 sets the operation mode of the memory controller 306. Also, the memory controller operation mode setting register 505 sets the operation mode of the memory controller 307, and the memory controller operation mode setting register 506 sets the operation mode of the memory controller 308.

The auto refresh rate register 507 is a register for storing an auto-refresh rate period that the memory controller 305 issues to the SDRAM 301. The CPU 101 calculates and sets the auto-refresh rate period. The memory controller 305 issues an auto-refresh command to the SDRAM 301 upon every cycle of the period set in this register 507. The details relating to a setting flow for setting this register will be explained later.

The auto refresh rate registers 508-510 similarly are registers for storing auto-refresh rate periods that the memory controllers 305-308 respectively issue to the SDRAMs 301-304. The memory controllers 306-308 respectively issue auto-refresh commands to the SDRAMs 301-304 upon every cycle of the periods set in these registers 508-510.

Figure 6:
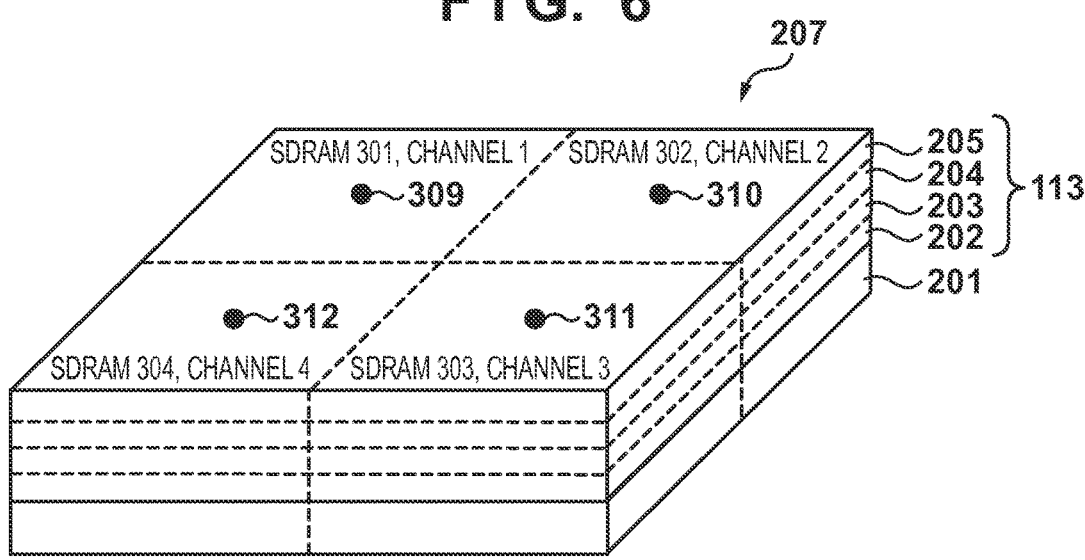
FIG. 6 is a schematic view of an SOC package for explaining simply a physical positional relationship between the WideIO-SDRAM and the SOC die according to the first embodiment.

FIG. 6 depicts an overhead view of the SOC package 207 for explaining simply a physical positional relationship between the WideIO-SDRAMs 202-205 and the SOC die 201 of FIG. 2A.

The SOC die 201 includes the CPU 101, the device I/F 107, the RIP 111, and the previously described the image processing units 108-110. A top-left, a top-right, a bottom-right, and a bottom-left, when a flat surface of the SOC package 207 is divided into four, each correspond to the channels 1-4 of FIG. 2B. Also, similarly, the four divided regions respectively correspond to the SDRAMs 301-304 of FIG. 3. As previously explained, the WideIO-SDRAM 113 is a memory stacked on the SOC die 201. Also, in the first embodiment, each device of the SDRAMs 301-304 is assumed to be stacked in four layers each on a respective upper part of one of the four divided regions of the SOC die 201 as in FIG. 6. Into the devices of the SDRAMs 301-304, the temperature sensors 309-312 are respectively built in order to be able to measure an internal temperature of each of the memories (SDRAMs). However, the arrangement of each of the SDRAMs and the arrangement of the temperature sensors is not limited to those of FIG. 6, and FIG. 6 merely shows one example.

FIG. 7A shows an arrangement of each of the SDRAMs 301-304 that comprise in the WideIO-SDRAM 113, and FIG. 7B depicts a view representing a positional relationship of 6×6 regions into which the SOC die 201 is divided equally according to the first embodiment.

Each of the SDRAMs 301-304, as previously explained, is stacked on a respective upper part of one of the four regions into which the SOC die 201 is divided, and here the regions are assumed to be the regions A-D as shown in FIG. 7A. Also, for the SOC die 201, each of the regions A-D is further divided into 3×3, and as shown in FIG. 7B, these divided regions are A1-A9, B1-B9, C1-C9, and D1-D9. Heat generated by activating one of the regions of the SOC die 201 is transmitted to the SDRAMs 301-304 positioned on an upper layer portion, and this heat exerts a strong influence on electric power consumption and access performance of the SDRAMs 301-304. Here, the temperature sensors 309-312 explained previously are assumed to be arranged at the regions A5, B5, C5 and D5 respectively.

FIG. 8 depicts a view for explaining a table that represents regions shown in FIG. 7B of the SOC die 201 to which functions of the MFP 100 are allocated, and amounts of heat generation when the regions are activated in relative values according to the first embodiment. Note, in the explanation below, a table and various values stored in the HDD 105 shown in FIG. 18B are referenced.

In FIG. 8, because, for example, the CPU 101 is laid out straddling the regions A6, B1, B2, B4 and B5, in a case where the CPU 101 is operating, these regions are activated. Because of this, when the CPU 101 is activated, an amount of heat generation in a unit time of a region A of FIG. 7A is "1", and an amount of heat generation of a region B is "10" (=2+2+3+3). Also, the print image processing unit 109 is laid out straddling the regions B8, C1, C2, C4, C5 and C6. Thus, in a case where the print image processing unit 109 is activated, an amount of heat generation in the unit time of the region B of FIG. 7A is "2", and an amount of heat generation in the unit time of the region C is "11" (=2+3+3+2+1). The information of the table of FIG. 8 is obtained in advance at the time of designing the SOC die 201 and stored in the ROM 106 or the HDD 105. Here, it is assumed that the information of the table of FIG. 8 is stored in the HDD 105 as a heat value table 1810 (FIG. 18B). Note, the information of the table of FIG. 8 of which functional blocks of FIG. 1 are allocated to which regions of the SOC die 201 can be obtained as layout information at the time of designing the SOC die 201. Also, an amount of heat generation when each region is activated is obtained with a heat simulation, or the like, at the time of designing the SOC die 201.

Explanation is given of an approach in which the auto-refresh rate is automatically updated in accordance with temperature of hotspots in the WideIO-SDRAM 113 in the MFP 100, which has the configuration explained above.

FIG. 9 depicts a view for explaining a state of updating an auto-refresh rate in accordance with a change of the temperatures of hotspots of the WideIO-SDRAM 113 in the MFP 100 according to the first embodiment.

For the MFP 100, after an electric power supply is turned on at time T0, and after an initialization of the device, and boot processing such as an activation of an OS is executed, and an idling mode of job waiting is transitioned into at time T1. Furthermore, at time T2, a print job is received, and a print mode is transitioned into. Then, after the print job has completed, at time T3, once again, the idling mode is transitioned into, and then at time T4, a scan job is initiated.

In this way, because the function modules that activated on the SOC die 201 switches, and an amount of heat generation changes due to the operational state of the MFP 100 changing, and the positions of the hotspots of the WideIO-SDRAM 113 and the temperatures of the hotspots change in real-time.

In conventional memory access control approaches, a maximum temperature 901 (tempMAX) for all of the operational states is assumed, and memory refreshing is performed by fixedly setting an auto-refresh rate 902 (rate_MAX) that corresponds to the maximum temperature 901.

In contrast to this, in the first embodiment, the auto-refresh rate is changed as shown in numeral 903 in accordance with an amount of heat generation of the SOC die 201. Because of this, compared to the rate_MAX 902 of the conventional auto-refresh rate, the number of times that an auto-refresh is performed is reduced with the auto-refresh rate 903 according to the first embodiment, and the memory bandwidth of the SDRAM 113 can be increased.

Next, detailed explanation will be given of auto-refresh rate updating processing according to this embodiment.

Figure 10:
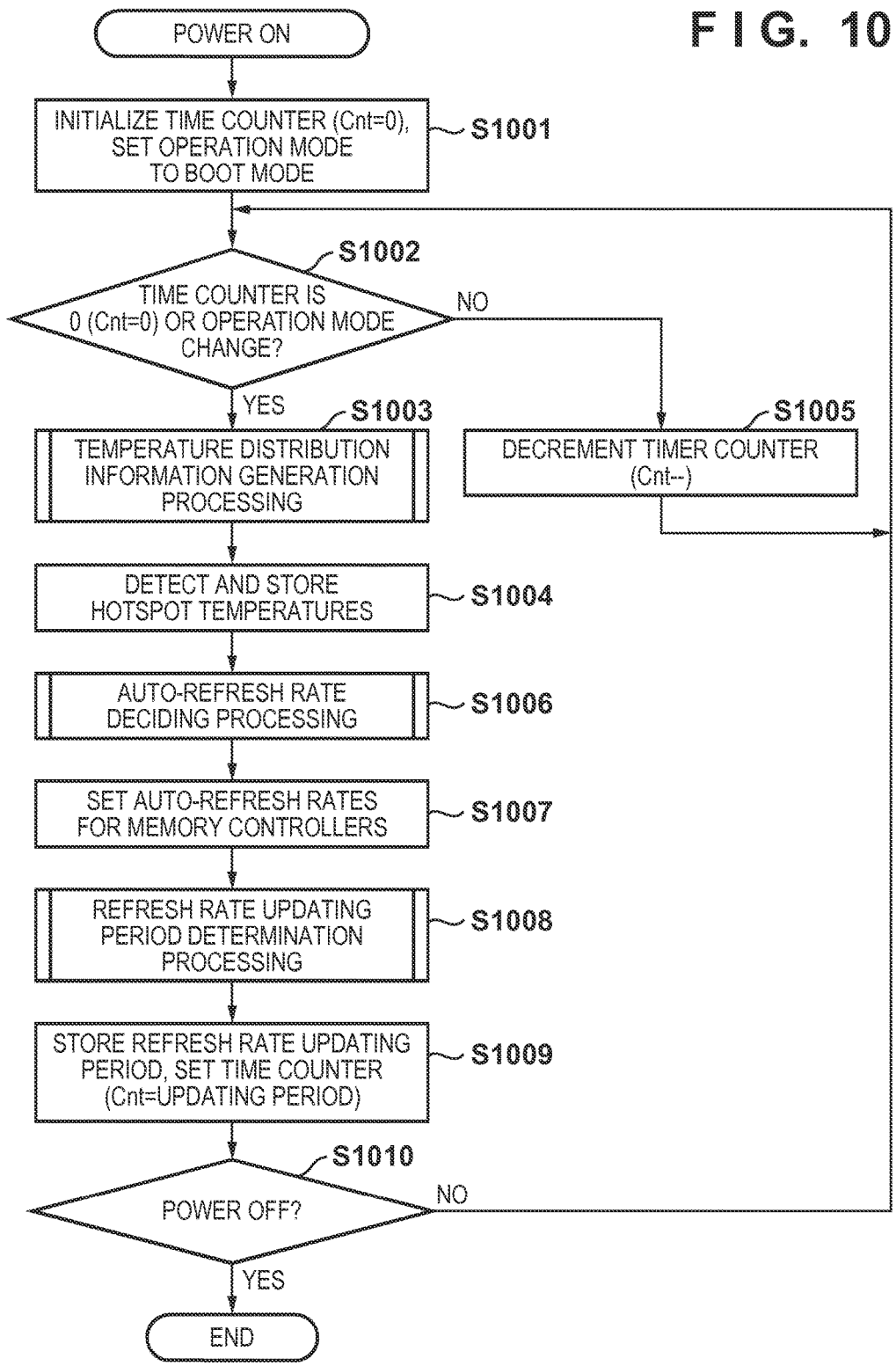
FIG. 10 is a flowchart for describing a memory access control approach that the MFP performs according to the first embodiment.

FIG. 10 is a flowchart for describing a memory access control approach that the MFP 100 performs according to the first embodiment. Note, a program for executing this processing is installed in the HDD 105, and the program is loaded into the WideIO-SDRAM 113 upon execution, and by the CPU 101 executing the loaded program, the processing shown in this flowchart is executed.

This processing is initiated by an electric power supply of the MFP 100 being turned on (corresponds to time T0 of FIG. 9). When the electric power supply is turned on, the CPU 101, in step S1001, initializes a time counter (Cnt) arranged in an area 1811 (FIG. 18B) of the HDD 105, or in SDRAM, to "0", and sets the operation mode to a boot mode. Note, the processing from step S1002 is performed based on timing by a timer (not shown) of the CPU 101. Also, information of the operation mode is stored in the area 1811 (FIG. 18B) of the HDD 105.

When there is an interrupt from the timer, the processing proceeds to step S1002, and the CPU 101 determines whether or not a value of the time counter (Cnt) is "0" or the operation mode changed. Here, first, because the initial value of the time counter (Cnt) is "0", the processing proceeds to processing for updating the auto-refresh rate by step S1003 through step S1004 and step S1006 through step S1009.

Firstly, in step S1003, the CPU 101 executes generation processing of temperature distribution information. This processing is explained with reference to the flowchart of FIG. 11.

Figure 11:
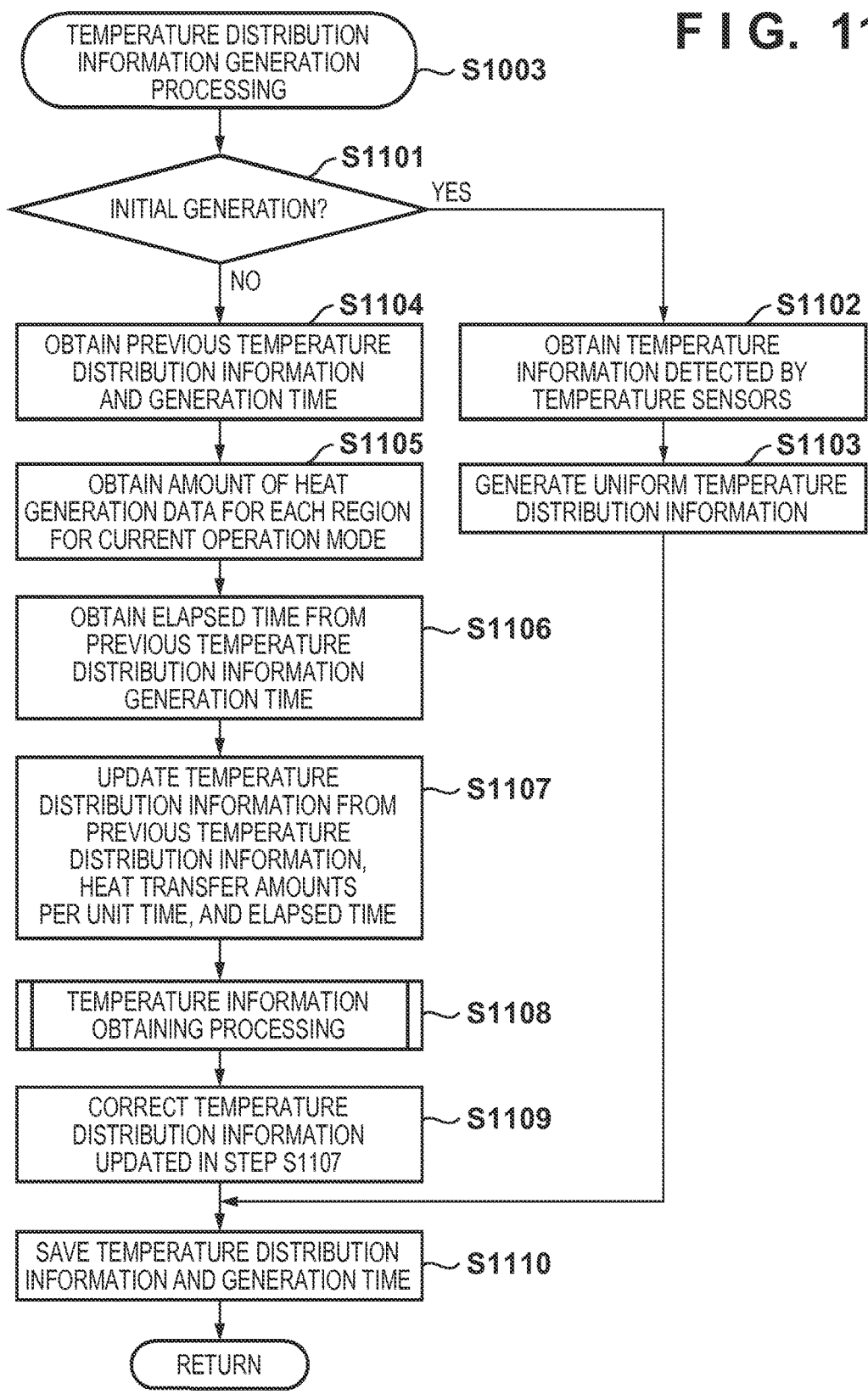
FIG. 11 is a flowchart for describing temperature distribution information generation processing of step S1003 of FIG. 10.

FIG. 11 is a flowchart for describing generation processing of temperature distribution information in step S1003 of FIG. 10.

Firstly, in step S1101, the CPU 101 determines whether or not to perform initial generation processing of the temperature distribution information for immediately after the electric power supply is turned on. If the CPU 101 determines to perform initial generation processing of the temperature distribution information, the processing proceeds to step S1102, and because temperatures of the SDRAMs 301-304 should be substantially equivalent to room temperature, the CPU 101 obtains temperature information detected by the temperature sensors 309-312. Next, the processing proceeds to step S1103, the CPU 101 generates uniform temperature distribution information based on the temperature information obtained in step S1102, and the processing proceeds to step S1110. In step S1110, the temperature distribution information generated in step S1103 and a generation time of the temperature distribution information generated in step S1103 are saved in an area 1812 (FIG. 18B) of the HDD 105, and the processing completes.

Meanwhile, when the CPU 101, in step S1101, determines not to be the initial generation processing of the temperature distribution information, the processing proceeds to step S1104. In step S1104, the CPU 101 obtains the temperature distribution information generated the immediately preceding time and the time that the temperature distribution information was generated the immediately preceding time from the area 1812 of the HDD 105 because the temperature distribution information at the immediately preceding time exists. Next, the processing proceeds to step S1105, and the CPU 101 obtains amount of heat generation data (refer to FIG. 8) for each region of the SOC die 201 corresponding to the current operation mode from the heat value table 1810 of the HDD 105. Next, the processing proceeds to step S1106, and the CPU 101 obtains an elapsed time period from the temperature distribution information generation time of the immediately preceding time based on a timing value of a timer (not shown) of the CPU 101 and the temperature distribution information generation time of the immediately preceding time. Next, the processing proceeds to step S1107, and the CPU 101 calculates the current temperature distribution information by performing a simple heat simulation.

In other words, from the temperature distribution information of the immediately preceding time, and the amount of heat generation information for each of the current regions obtained in step S1105, a heat transfer amount per unit time is obtained for each region, and the elapsed time from the generation time of the immediately preceding temperature distribution information is multiplied with each of the heat transfer amounts. Total transfer amount of heat on the SOC die 201 is obtained, and the current temperature distribution information is obtained. The current temperature distribution information obtained in this way is temporarily stored in the SDRAM 113. Then, the processing proceeds to step S1108, and the CPU 101 obtains temperature information measured by the temperature sensors 309-312, and, in step S1109, the CPU 101 corrects the temperature distribution information obtained in step S1107.

Figure 12:
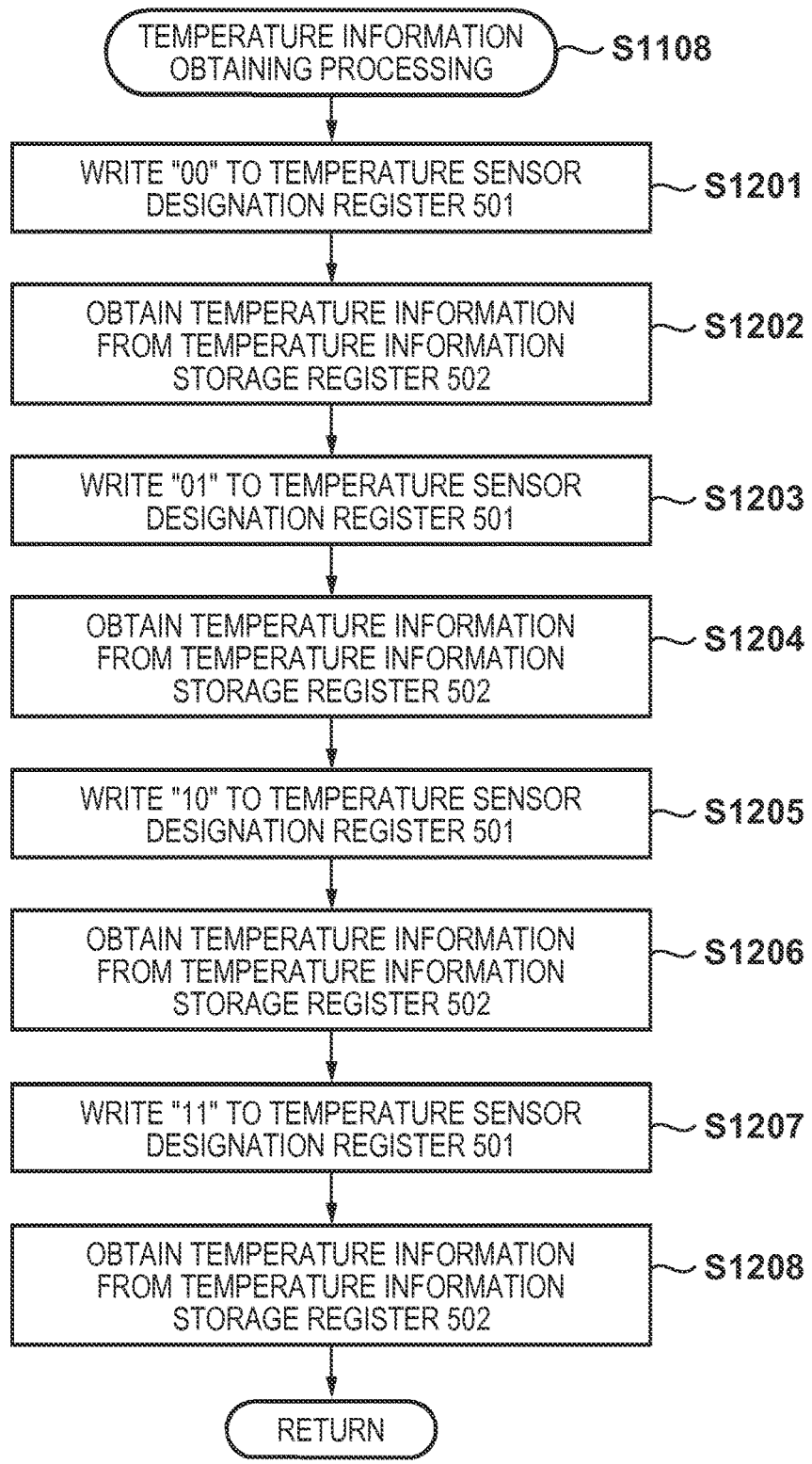
FIG. 12 is a flowchart for describing processing (step S1108 of FIG. 11) for acquiring temperature information that a CPU measures with temperature sensors in the MFP according to the first embodiment.

FIG. 12 is a flowchart for describing processing (step S1108 of FIG. 11) for acquiring temperature information that the CPU 101 measures with the temperature sensors 309-312 in the MFP 100 according to the first embodiment. Because, in the first embodiment, there is a configuration in which four temperature sensors are arranged, temperature information is obtained from four temperature sensors in the flowchart of FIG. 12.

Firstly, in step S1201, the CPU 101 writes "00" to the temperature sensor designation register 501. In the first embodiment, because four temperature sensors are provided, it is assumed that each temperature sensor and setting values of the temperature sensor designation register 501 are associated as follows in order to designate each temperature sensor. That is, it is assumed that the value of the temperature sensor designation register 501 "00" is associated with the temperature sensor 309, and similarly "01" is associated with the temperature sensor 310, "10" is associated with the temperature sensor 311, and "11" is associated with the temperature sensor 312 respectively. Accordingly, in step S1201, because the temperature sensor 309 is designated, the CPU 101 writes "00" into the temperature sensor designation register 501. Next, the processing proceeds to step S1202, and the CPU 101 dispatches a temperature information read request to the temperature information storage register 502, and obtains temperature information measured by the temperature sensor 309. As described above, here, when the temperature information storage register 502 detects a read request from the CPU 101, temperature information is obtained from the temperature sensor designated by the temperature sensor designation register 501. Then, the obtained temperature information is output to the CPU 101 as response data of the read request from the CPU 101. Accordingly, in step S1202, the CPU 101 obtains temperature information that the temperature sensor 309 measured.

Next, the processing proceeds to step S1203, and the CPU 101, in order to obtain the temperature information measured by the temperature sensor 310, writes "01" to the temperature sensor designation register 501. Next, the processing proceeds to step S1204, and the CPU 101 dispatches a temperature information read request to the temperature information storage register 502, and obtains temperature information measured by the temperature sensor 310. Next, the processing proceeds to step S1205, and the CPU 101, in order to obtain the temperature information measured by the temperature sensor 311, writes "10" to the temperature sensor designation register 501. Next, in step S1206, and the CPU 101 dispatches a temperature information read request to the temperature information storage register 502, and obtains temperature information measured by the temperature sensor 311. Next, the processing proceeds to step S1207, and the CPU 101, in order to obtain the temperature information measured by the temperature sensor 312, writes "11" to the temperature sensor designation register 501. Next, in step S1208, and the CPU 101 dispatches a temperature information read request to the temperature information storage register 502, and obtains temperature information measured by the temperature sensor 312. By the above processing, the CPU 101 is able to obtain temperature information measured by each temperature sensor, that is, the temperature information of each SDRAM or each channel. The temperature information measured by each temperature sensor obtained in this way is temporarily stored in the SDRAM 113.

When the temperature information of each SDRAM is obtained, the processing proceeds to step S1109, and the CPU 101, using the temperature information measured by each of the temperature sensors obtained in step S1108, corrects the temperature distribution information of each region shown in FIGS. 7A and 7B.

FIG. 13 depicts a view for explaining a concrete example of correcting temperature distribution information using temperature information obtained by the temperature sensors 309-312 in the first embodiment.

Numeral 1300 denotes temperature values detected by the temperature sensors 309-312, which are 53° C., 55° C., 55° C. and 54° C. respectively. Note, because each temperature sensor is arranged in a center of each of the SDRAMs 301-304, the temperatures measured for each temperature sensor are temperatures of the regions A5, B5, C5 and D5 in the center of each SDRAM as can be seen from FIGS. 7A and 7B. Numeral 1301 denotes concrete examples of temperature distribution information (temperatures prior to correction) obtained in step S1107 of FIG. 11 and saved temporarily in SDRAM. In the case of the region A5, because both the temperature that the temperature sensor 309 detects, and the temperature prior to the correction are the same (53° C.), the temperatures from the regions A1-A9 are unchanged. In the case of the region B5, while the temperature that the temperature sensor 310 detects is 55° C., the temperature prior to the correction is 54° C. Accordingly, the temperature of the regions from B1 to B9 each became higher by 1° C. For the other regions, similarly, because the temperature that the temperature sensor 311 of the region C5 detects is the same as the temperature prior to correction, the temperature of the regions from C1 to C9 is unchanged. Also, regarding the region D5, while the temperature that the temperature sensor 312 detects is 54° C., the temperature prior to correction is 55° C. Accordingly, the temperatures of the regions from D1 to D9 each became lower by 1° C.

By the above processing, as shown in numeral 1302 of FIG. 13, for example, temperature distribution information that corrects the temperature distribution information of the immediately preceding time with the current temperatures of each SDRAM is generated, and configuration is taken such that the temperature differences are not accumulated.

In this way, once again the processing returns to FIG. 11, and when either the temperature distribution information corrected in step S1109 is obtained or identical temperature distribution information is obtained in step S1103, the processing proceeds to step S1110. In step S1110, the CPU 101 stores the temperature distribution information in the area 1812 of the HDD 105 along with the current time information. The above is the temperature distribution information generation processing of step S1003.

Next, the processing returns to FIG. 10 once again, and when the temperature distribution information generation processing of step S1003 ends, the processing proceeds to step S1004.

In step S1004, the CPU 101 obtains temperature of hotspots which are the maximum temperatures of the SDRAMs 301-304 from the temperature distribution information generated in step S1003. Then, the maximum temperatures of the SDRAMs 301-304 are stored in a current hotspot temperature information storage area (FIG. 18B) in an area 1815 of the HDD 105. Here, the temperature information stored in the current hotspot temperature information storage area is moved to a previous hotspot temperature information storage area in the area 1815. The temperature values stored this way are used in refresh rate updating period determination processing of later described step S1008. Here, the temperature of the hotspot of the SDRAM 301 is the maximum temperature value in the regions A1-A9. Also, the temperature of the hotspot of the SDRAM 302 is the maximum temperature value in the regions B1-B9. Similarly, the temperatures of the hotspots of the SDRAMs 303 and 304 are the maximum temperature value of the regions C1-C9, and the maximum temperature value of the regions D1-D9 respectively.

Next, the processing proceeds to step S1006, and the CPU 101 executes processing for deciding the auto-refresh rate necessary in accordance with the temperature value of the hotspot of each SDRAM. Below, explanation will be given for this processing in detail.

Figures 14A, 14B:
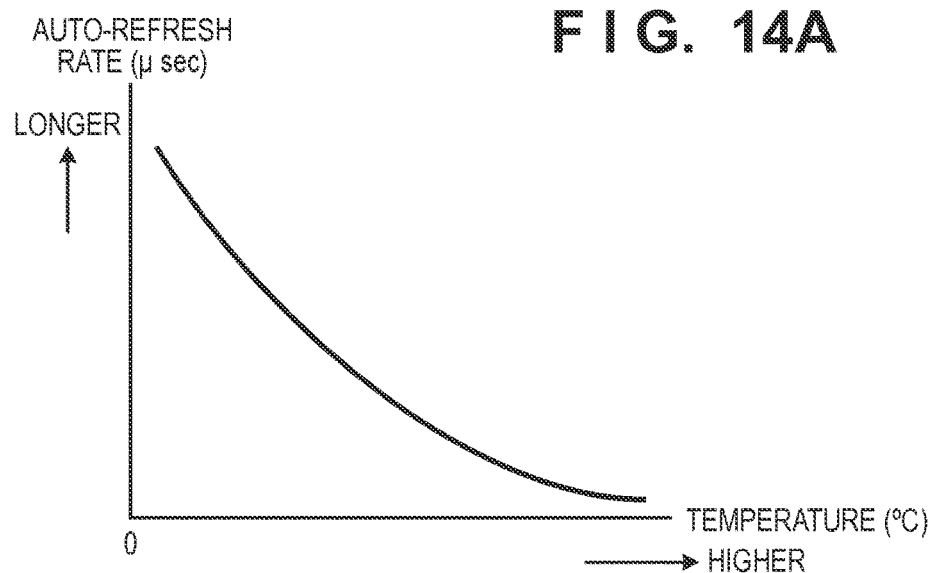
FIGS. 14A and 14B depict views for explaining a relationship between the auto-refresh rate and the temperature.

FIGS. 14A and 14B depict views for explaining a relationship between the auto-refresh rate and the temperature.

FIG. 14A shows temperature (° C.) on the abscissa axis, and auto-refresh rate (time interval) (μsec) on the ordinate axis. In general, a data holding time period in an SDRAM is known to become smaller in geometric progression as the temperature increases. For this reason, it can be seen that accompanying an increase in temperature, the auto-refresh rate (μsec) becomes shorter.

FIG. 14B depicts a view for illustrating an example of a table in which this temperature and the auto-refresh rate necessary for data retention is set in 2° C. steps. A refresh rate table is stored in an area 1813 (FIG. 18B) of the HDD 105. In FIG. 14B, numeral 1401 denotes an index, numeral 1402 denotes a temperature range divided by 2° C. steps, and numeral 1403 denotes an auto-refresh rate (μsec) corresponding to the temperature range.

With reference to the table of FIG. 14B, explanation will be given for a procedure for deciding the auto-refresh rate from the temperature value of the hotspot, with reference to the flowchart of FIG. 15.

Figure 15:
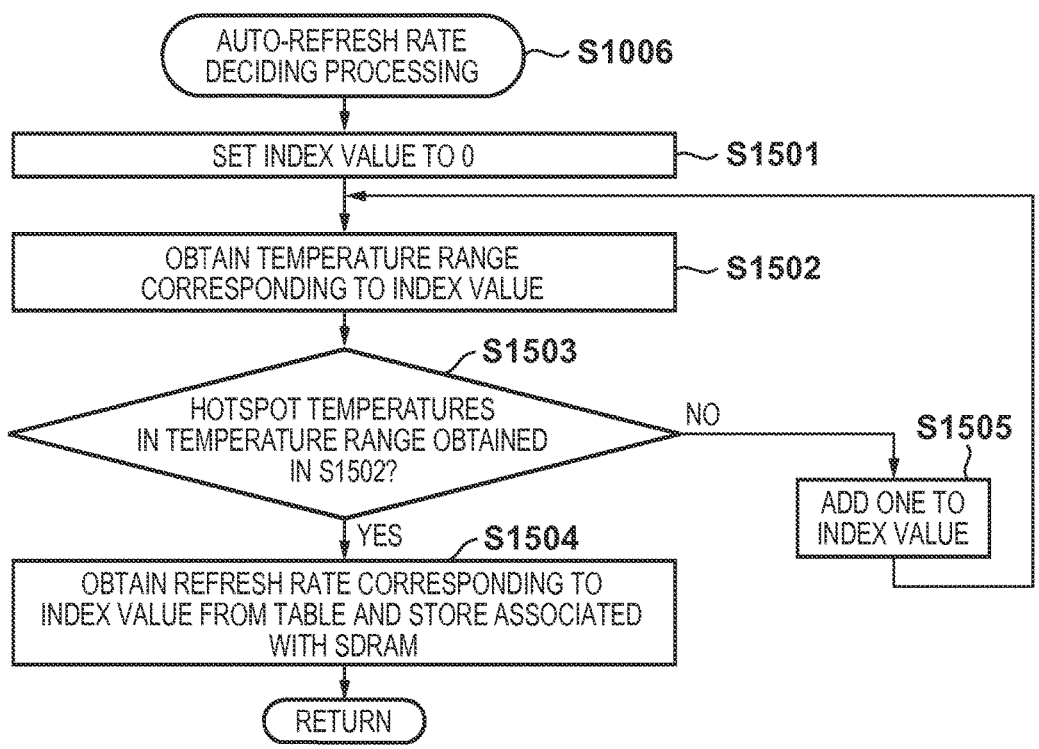
FIG. 15 is a flowchart for describing processing for determining the auto-refresh rate of step S1006 of FIG. 10.

FIG. 15 is a flowchart for describing processing for deciding the auto-refresh rate of step S1006 of FIG. 10. The CPU 101 executes the processing described in FIG. 15 for each of SDRAMs 301-304.

Firstly, in step S1501, the CPU 101 initializes index values to be 0 (stored in SDRAM or the HDD 105) for referencing the table. Next, the processing proceeds to step S1502, and the CPU 101 obtains the temperature range corresponding to the index value from the refresh rate table in the area 1813. Next, the processing proceeds to step S1503, and the CPU 101 determines whether or not the temperature of the hotspot obtained in step 1004 is within the obtained temperature range. If the temperature of the hotspot obtained in step S1004 is not within the temperature range, the processing proceeds to step S1505, the CPU 101 adds one to the index value, and the processing proceeds to the next temperature range read processing of step S1502.

Meanwhile, when, in step S1503, it is determined that the temperature of the hotspot obtained in step S1004 is within the temperature range, the processing proceeds to step S1504, and the CPU 101 obtains the auto-refresh rate corresponding to the temperature range from the table in the area 1813, and sets the obtained auto-refresh rate as the auto-refresh to be decided. Note, because the temperature ranges of the table shown in FIG. 14B are set with temperature ranges that SDRAM can take, a situation will always occur in which, in the flowchart of FIG. 15, the processing proceeds to step S1504 from step S1503 for one of the index values.

When, in step S1006 of FIG. 10, each SDRAM auto-refresh rate is determined based on the temperature of the hotspot of each SDRAM, the processing proceeds to step S1007 of FIG. 10.

In step S1007, the CPU 101 sets the auto-refresh rates for the SDRAMs 301-304 determined in step S1006 to the auto-refresh registers 507-510 (FIG. 5) corresponding to the memory controllers 305-308, respectively. Also, these auto-refresh rates are stored in an area 1818 (FIG. 18B) of the HDD 105. With this, the memory controllers 305-308 begin to dispatch auto-refresh commands to the SDRAMs 301-304 at the periods set in the auto-refresh registers 507-510 respectively.

Next, the processing proceeds to step S1008, and the CPU 101 decides the period at which the auto-refresh rates are updated next. Here, based on the highest temperature out of all of the SDRAMs 301-304, focus is on an amount of the temperature change per unit time. So, in a case where the temperature change per unit time is large, a short updating period is set, and in a case where the temperature change is small, a long updating period is set. In this way, the frequency at which the auto-refresh rates are updated is changed dynamically. Because of this, unnecessary updating of the auto-refresh rate can be suppressed in a case where the temperature change is small.

Figure 16:
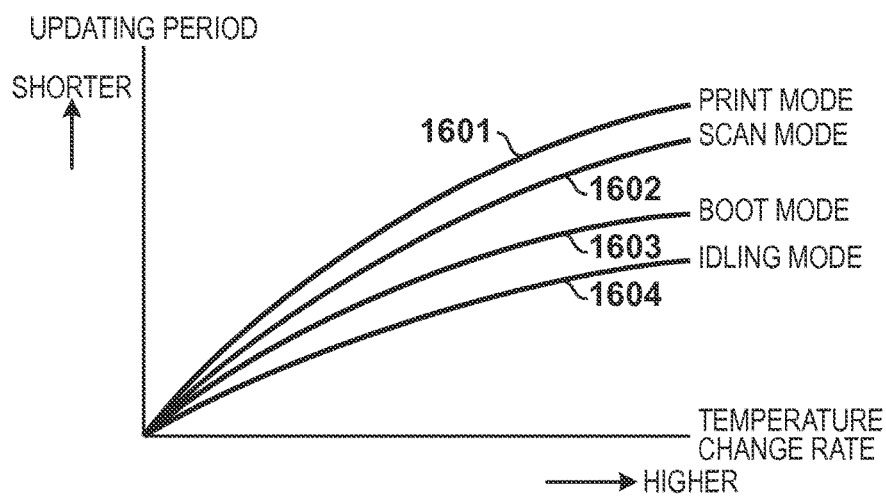
FIG. 16 depicts a view for showing a relationship between temperature change per unit time (hereinafter, temperature change rate) and an updating period.

FIG. 16 depicts a view for showing a relationship between temperature change per unit time (hereinafter, temperature change rate) and the updating period. In FIG. 16, the abscissa axis represents temperature change rate, and the ordinate axis represents the updating period for updating the auto-refresh rate.

In the first embodiment, configuration is taken such that, by shortening the updating period when the temperature change rates becomes larger, a precision of the auto-refresh rates is maintained in a case where the temperature changes are large. Also, because generated heat information, that corresponds to the operation mode used in the temperature distribution information generation processing of step S1003, is an average value in a predetermined time period of the operation mode, a state in which a large amount of heat is generated may be entered in terms of time locally. For this reason, for operation modes, out of the operation modes of the MFP 100, for which the amount of heat generation of the SOC die 201 is large, a larger margin is taken and the updating period is shortened. For example, in the print mode, because the amount of heat generation of the SOC die 201 is larger than in the idling mode, a shorter updating period than that of a characteristic curve 1604 for the idling mode is set, as shown in a characteristic curve 1601 representing a relationship between the temperature change rate and the updating period in the print mode. Similarly, the amount of heat generation of the SOC die 201 in the scan mode is slightly lower than in the print mode. Thus, a characteristic curve 1602 in the scan mode is set to have a slightly longer updating period than the characteristic curve 1601 of the print mode. Also, the amount of heat generation in the boot mode is slightly lower than in the scan mode, but higher than in the case of the idling mode. Accordingly, a characteristic curve 1603 of the boot mode has a slightly longer updating period than the characteristic curve 1602 of the scan mode, and the updating period is set to be shorter than that of the characteristic curve 1604 of the idling mode.

The relationship between the temperature change rate and the updating period shown in FIG. 16 is tabulated in advance for each operation mode and stored in a table 1814 (FIG. 18B) in the HDD 105.

FIGS. 17A through 17D depict views for illustrating examples of the relationships between temperature change rate and updating period tabulated for each operation mode. Here, because the updating period is controlled with the values set in the time counters in step S1009, counter values in the tables are prepared as updating periods. These tables are stored in the HDD 105 as tables in an area 1816.

FIG. 17A shows an example of a table representing a relationship between the temperature change rate and the updating period used for the print mode. In FIG. 17A, numeral 1702 denotes the ranges that a temperature change rate can take (divided and listed), numeral 1703 denotes updating periods for the print mode corresponding to these ranges, and numeral 1701 denotes an index.

FIG. 17B depicts a view for illustrating an example of a table representing a relationship between the temperature change rates and the updating periods used for the scan mode. In FIG. 17B, numeral 1712 denotes the ranges that the temperature change rate can take (divided), and numeral 1713 denotes updating periods in the scan mode corresponding to the temperature change rates. Numeral 1711 denotes an index. FIG. 17C depicts a view for illustrating an example of a table representing a relationship between the temperature change rates and the updating periods used for the boot mode. In FIG. 17C, numeral 1722 denotes the ranges that the temperature change rate can take (divided), and numeral 1723 denotes updating periods in the boot mode corresponding to the temperature change rates. Numeral 1721 denotes an index. FIG. 17D shows a view for illustrating an example of a table representing a relationship between the temperature change rates and the updating periods used for the idling mode. In FIG. 17D, numeral 1732 denotes the ranges that the temperature change rate can take (divided), and numeral 1733 denotes the updating periods in the idling mode corresponding to the temperature change rates. Numeral 1731 denotes an index.

Figure 18A:
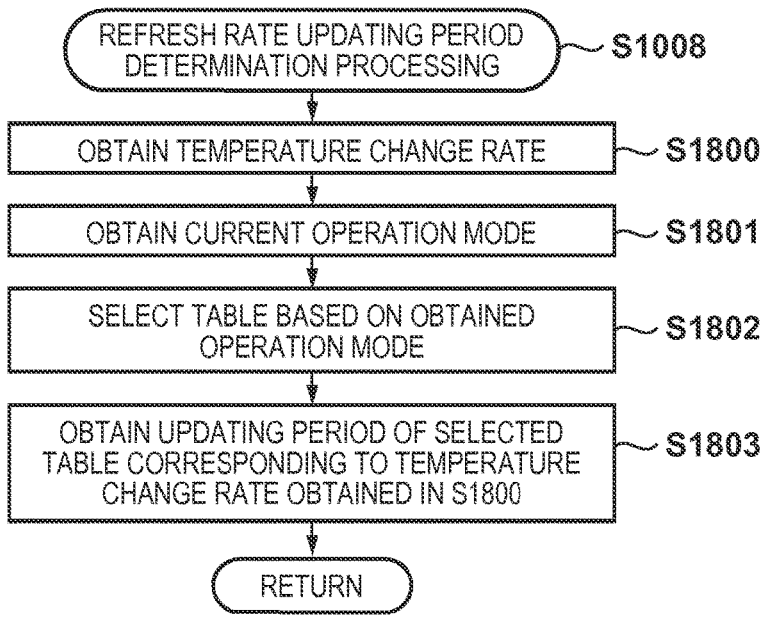
FIG. 18A is a flowchart for describing processing for determining refresh rate updating period of step S1008 of FIG. 10.
Figure 18B:
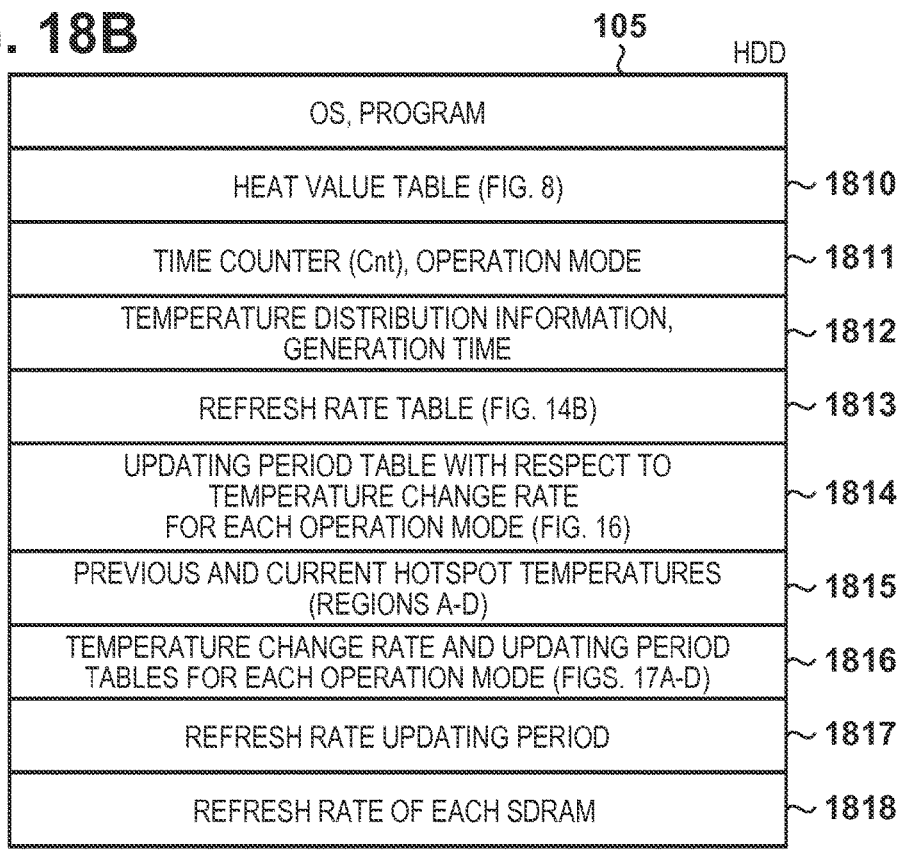
FIG. 18B depicts a view for explaining a data configuration of the HDD.

FIG. 18A is a flowchart for describing processing for determining the refresh rate updating period of step S1008 of FIG. 10.

Firstly, in step S1800, the CPU 101 obtains the temperature change rate. More specifically, the CPU 101 obtains the maximum temperature value of the current hotspots obtained in step S1004 and stored in the area 1815 of the HDD 105, obtains the maximum temperature value of the hotspots detected in step S1004 of the immediately preceding time and stored in the area 1815 of the HDD 105, calculates a difference between the temperature values, and obtains temperature change values. Then, the refresh rate updating period determined in step S1009 of the immediately preceding time is read out from an area 1817 (FIG. 18B) of the HDD 105, and with the updating period, the temperature change rates are obtained by dividing the calculated temperature differences.

Next, the processing proceeds to step S1801, and the CPU 101 obtains information of the current operation mode stored in the area 1811 of the HDD 105. Next, the processing proceeds to step S1802, and the CPU 101 selects the table (one of FIG. 17A through FIG. 17D) corresponding to the operation mode obtained in step S1801 from the tables stored in the area 1816 of the HDD 105. Next, the processing proceeds to step S1803, and the CPU 101 obtains the updating period corresponding to the temperature change rate obtained in step S1800 with reference to the temperature change rate ranges of the table selected in step S1802. In this way, the refresh rate updating period determination processing of step S1008 ends.

Then, the processing proceeds to step S1009 of FIG. 10, and the CPU 101 stores the refresh updating period determined in step S1008 into an area 1817 (FIG. 18B) of the HDD 105, and sets the time counter (Cnt) of the area 1811. In this way, the stored refresh updating period is used in step S1008 of the next loop. Next, the processing proceeds to step S1010, and the CPU 101 determines whether or not a power off request occurred, and if the power off request occurred, the processing completes. However, normally, because the power off request does not occur, the processing returns to step S1002, and until the updating period set for the time counter (Cnt) elapses, the processing of step S1002→step S1005→step S1002 is executed repeatedly. In step S1005, the CPU 101 subtracts one at a time from the value of the time counter (Cnt), and when the counter values becomes "0", that is the refresh rate updating period set in step S1009 elapse, the processing of step S1003-step S1004 and step S1006-step S1009 is performed. Note that if, for example, the updating period is 50 μsec and an interrupt by the timer occurs every 1 μsec, the time counter (Cnt) is set to "50". With this, every 50 μsec, the processing of step S1003-step S1004 and step S1006-step S1009 is executed, and the refresh rate of each SDRAM is updated.

By the first embodiment, as explained above, a maximum temperature of each SDRAM of a WideIO memory device is measured, and refresh rates of SDRAMs corresponding to these temperatures are determined. With this, refreshing of each corresponding SDRAM can be performed at a period in accordance with the temperature of the SDRAM. For this reason, compared to a case of setting the refresh rate uniformly as is done conventionally, the number of times that the auto-refresh is performed can be reduced, and correspondingly the memory bandwidth of the SDRAM 113 can be increased.

In addition, by changing the updating period at which the above described refresh rates are determined in accordance with the temperature change rates per predetermined interval for each SDRAM and the operation mode, a most efficient timing for determining the refresh rate can be determined for each SDRAM. With this, because the number of times of that the refresh rate is updated can be made to be appropriate and the updating can be performed efficiently, there is the effect that the load on the CPU can be reduced and an increase of electric power consumption and generated heat of the SOC die can be suppressed.

Second Embodiment

Next, a second embodiment of the present invention is explained. Note, because the configuration of the MFP 100 according to the second embodiment is the same as that of the previously described first embodiment, explanation of it is omitted.

In the previously described first embodiment, the auto-refresh rate updating periods of the tables as shown in FIG. 17A through FIG. 17D are referenced, but in the second embodiment, explanation will be given for a case in which the previously described tables are not referenced.

Figures 19A, 19B, 19C:
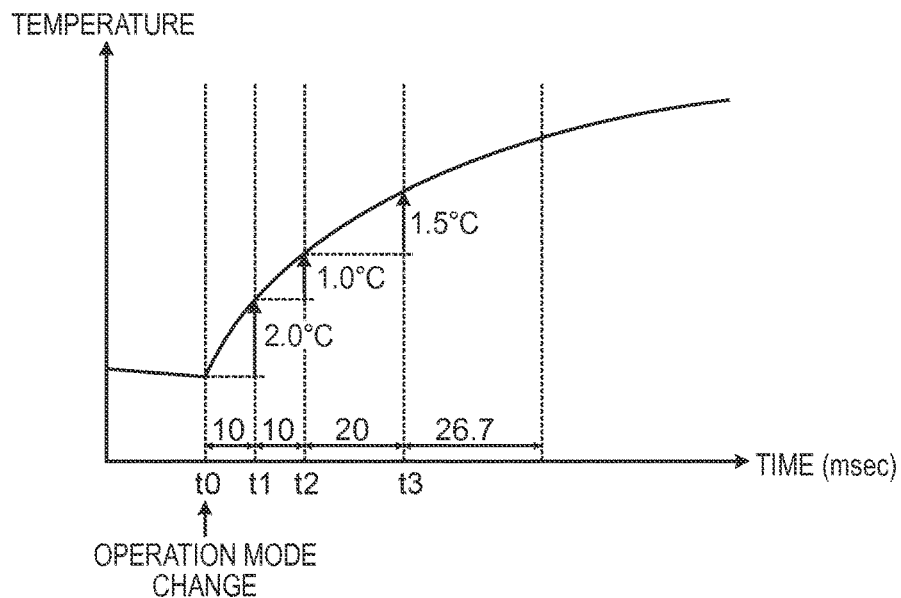
FIGS. 19A through 19C depict views for explaining processing for determining refresh rate updating period according to a second embodiment.

FIGS. 19A through 19C depict views for explaining processing for deciding the refresh rate updating period according to a second embodiment.

FIG. 19A depicts a view for showing in detail a portion (time T2 of FIG. 9) in which from a state in which the operation mode is the idling mode in FIG. 9, for example, a print job is received, and the print mode is transitioned into.

In general, it can be considered that in a case where the operation mode changes, the temperature change rate becomes larger, and the longer the time period in which the same operation mode continues, the smaller the temperature change rate becomes. Accordingly, in the second embodiment, when the operation mode is changed, a default updating period is set, and after the second refresh rate update, the updating period is newly determined in accordance with the temperature change rate and the updating period.

In FIG. 19A, the default period is made to be 10 msec. After the second refresh rate update, even if the immediately preceding temperature change rate continues, the updating period is determined such that a temperature difference of greater than or equal to 2° C. will not occur upon the next update of the auto-refresh rate. The following Equation 1 represents this as a function.

$$\text{Period}(i)=(2/\Delta t)\times \text{Period}(i-1) \quad \text{Equation 1}$$

Here, Period(i) is the updating period set upon the i-th auto-refresh rate update since the operation mode is changed, and Δt is a temperature change amount from the update of the auto-refresh rate of the immediately preceding time.

In FIG. 19A, when the operation mode is changed at time t0, the auto-refresh rate updating period is set to 10 msec. Then, when 10 msec elapse, and the refresh rate update timing is arrived at, the temperature has increased 2° C. Accordingly, at time t1, Δt=2.0, Period(0)=10 msec, while the updating period at time t1 from Equation 1 is Period(1)=10 msec. Similarly, because, at time t2, the temperature has increased by 1.0° C., Δt=1.0 and Period(1)=10, and the updating period at time t2, from Equation 1, is Period(2)=20 msec. Furthermore, because, at time t3, the temperature has increased by 1.5° C., Δt=1.5 and Period(2)=20, and the updating period at time t3, from Equation 1, is Period (3)=26.7 msec.

FIG. 19B depicts a view in which temperature changes for each of the above described times, and the updating periods determined at these times are put into a table.

Here, as illustrated in FIG. 19C, a predefined period for a mode change may be set in accordance with a transition of an operation mode upon an operation mode change. The amount of the temperature change upon the operation mode change is proportional to the amount of the change of heat generation of the SOC die 201 from before operation mode change to after the operation mode change. Accordingly, the amount of change of the amount of heat generation of the SOC die 201 when the operation mode is changed is obtained in advance, and in accordance with the amount of change, the predefined period may be determined in advance.

By the second embodiment, as explained above, because the refresh rate updating period is determined in accordance with the change of the operation mode, and the amount of temperature change, there are the effects that processing can be simplified, and the refresh rate updating period can be decided earlier.

Third Embodiment

Next, a third embodiment of the present invention is explained. Note, because the configuration of the MFP 100 according to the third embodiment is the same as that of the previously described first embodiment, explanation is omitted.

In the previously described first embodiment, the auto-refresh rate updating periods of the tables as shown in FIG. 17A through FIG. 17D are referenced, but in the third embodiment, explanation will be given for an example in which in succession new updating periods are calculated without referencing the previously described tables.

Figures 20A, 20B:
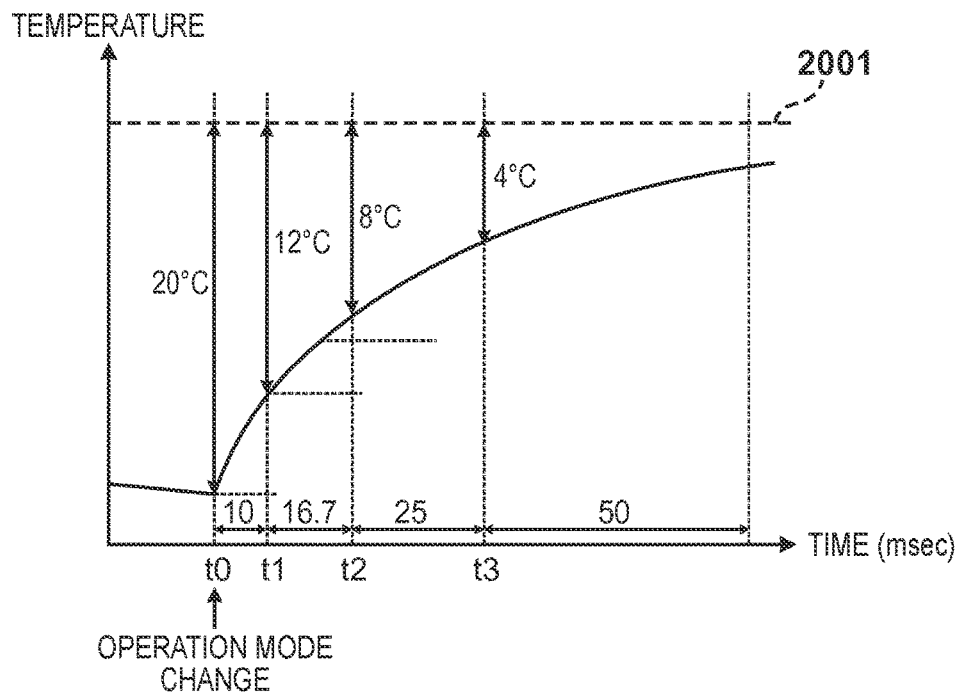
FIGS. 20A and 20B depict views for explaining processing for determining refresh rate updating period according to a third embodiment.

FIGS. 20A and 20B depict views for explaining processing for determining the refresh rate updating period according to a third embodiment.

FIG. 20A, similarly to FIG. 19A, depicts a view for showing in detail a portion (time T2 of FIG. 9) in which from a state in which the operation mode is the idling mode in FIG. 9, for example, a print job is received, and the print mode is transitioned into. Here, a temperature (predetermined temperature) 2001 to which the curve is asymptotic, when an operation mode continues for a long time, is a constant value, and the temperature 2001 is based on a property that the current temperature change rate is proportional to $\Delta T$ when the temperature difference with the current temperature is assumed to be $\Delta T$. In order to maintain the precision of the auto-refresh rate, the auto-refresh rate updating period may be made to be proportional to the temperature change rate. Accordingly, the auto-refresh rate updating period may be made to be proportional to the temperature change rate. From the above relationship, the auto-refresh rate updating period may be controlled to be inversely proportional to the temperature difference $\Delta T$ with the asymptotic temperature 2001.

When the equation for determining this updating period is represented as a function in Equation 2.

$$\text{Period}(i) = (1/\Delta T) \times 200 \quad \text{Equation 2}$$

Here, Period(i) is an updating period for setting upon the i-th auto-refresh rate update, and "200" is a coefficient chosen for simplicity of explanation.

Because, at time t0, $\Delta T=20°$ C., the predetermined updating period, Period(0), is 10 msec. Next, because, at time t1 after 10 msec, $\Delta T=12°$ C., from Equation 2, the updating period, Period(1) is approximately 16.7 msec. Next, because, at time t2 after 16.7 msec, $\Delta T=8°$ C., the updating period, Period(2), from Equation 2, is 25 msec. Furthermore, because, at time t0, $\Delta T=20°$ C., the predetermined updating period, Period(3), is 50 msec.

FIG. 20B depicts a view showing the results in a table.

The asymptotic temperature 2001 is determined uniquely according to the amount of heat generation of the SOC die 201 corresponding to the operation mode and an ambient temperature. Also, the ambient temperature can be obtained by step S1102 of the flowchart of FIG. 11 immediately after activation of the MFP 100. The asymptotic temperature 2001 of each operation mode corresponding to various ambient temperatures can be held in the HDD 105 in advance, and the temperature difference $\Delta T$ can be obtained by reading out the asymptotic temperature when the operation mode is changed.

FIG. 20B depicts a table representing an approach for determining the updating period in time series.

As explained above, by virtue of the third embodiment, the refresh rate updating period is determined in accordance with an asymptotic temperature (predetermined temperature) which is a constant value to which temperatures are asymptotic as an operation mode continues for a long time, and a temperature difference between the asymptotic temperature and the current temperature. With this, there are the effects that processing can be simplified, and the refresh rate updating period for each operation mode can be decided earlier.

As explained above, by virtue of the embodiments, there is the effect that, compared to a conventional example in which an auto-refresh rate corresponding to a maximum temperature is determined, the bandwidth of usable SDRAM is increased because the auto-refresh rate is dynamically updated as necessary.

Also, by reducing the auto-refresh rate update period when the temperature of DRAM is stable, there is the effect that a load for updating the refresh rate can be reduced.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-170822, filed Aug. 20, 2013, which is hereby incorporated by reference herein in its entirety.

The invention claimed is:

1. An information processing apparatus equipped with a WideIO memory device stacked on an SOC die including a CPU, comprising:

a temperature obtaining unit configured to obtain temperature information of each of a plurality of memories of the WideIO memory device;

a plurality of functional modules, included in the SOC die, for executing respective functions;

a generation unit configured to generate temperature distribution information of the WideIO memory device in accordance with respective execution of the plurality of functional modules;

a determination unit configured to obtain a maximum temperature of the WideIO memory device based on the temperature distribution information and determine a refresh rate of the WideIO memory device based on the maximum temperature;
an updating period decision unit configured to decide a period, at which the determination unit determines the refresh rate of the WideIO memory device, based on an operation mode of the information processing apparatus and a change rate of the maximum temperature for a predetermined time interval; and
a memory control unit configured to refresh the WideIO memory device in accordance with the refresh rate determined by the determination unit at the period determined by the updating period decision unit.

2. The information processing apparatus according to claim 1, wherein each of the plurality of memories of the WideIO memory device is arranged on a respective region that a flat surface of the SOC die is divided into.

3. The information processing apparatus according to claim 2, further comprising:
a storage unit configured to store amounts of heat generation that each of a plurality of regions generates in accordance with respective execution of the plurality of functional modules when each flat surface of the plurality of memories is divided into the plurality of regions;
an obtaining unit configured to obtain a current amount of heat generation of the WideIO memory device based on a function module executed in accordance with the operation mode, and amounts of heat generation corresponding to each region stored in the storage unit; and
a correction unit configured to correct temperature distribution information of an immediately preceding time based on an elapsed time since the generation unit generated the temperature distribution information at the immediately preceding time, and the current amount of heat generation of the WideIO memory device,
wherein the generation unit generates the temperature distribution information of the WideIO memory device by correcting the temperature distribution information corrected by the correction unit based on current temperature information of each of the plurality of memories obtained by the temperature obtaining unit.

4. The information processing apparatus according to claim 1, further comprising a refresh rate table associating the maximum temperature of the WideIO memory device and the refresh rate of the WideIO memory device,
wherein the determination unit determines the refresh rate of the WideIO memory device by referencing the refresh rate table.

5. The information processing apparatus according to claim 1, further comprising a table associating the operation mode of the information processing apparatus, the change rate of the maximum temperature, and the period,
wherein the updating period decision unit decides the period by referencing the table.

6. The information processing apparatus according to claim 5, wherein the change rate of the maximum temperature is the difference between a current value of the maximum temperature and an immediately previous value of the maximum temperature divided by a current period at which the determination unit determines the refresh rate.

7. An information processing apparatus equipped with a WideIO memory device stacked on an SOC die including a CPU, comprising:
a temperature obtaining unit configured to obtain temperature information of each of a plurality of memories of the WideIO memory device;
a plurality of functional modules, included in the SOC die, for executing respective functions;
a generation unit configured to generate temperature distribution information of the WideIO memory device in accordance with respective execution of the plurality of functional modules;
a determination unit configured to obtain a maximum temperature of the WideIO memory device based on the temperature distribution information and determine a refresh rate of the WideIO memory device based on the maximum temperature;
an updating period decision unit configured to decide a period, at which the determination unit determines the refresh rate of the WideIO memory device, based on an elapsed time since the determination unit determined the refresh rate of the WideIO memory device, and how much a temperature of the WideIO memory device has changed in the elapsed time; and
a memory control unit configured to refresh the WideIO memory device in accordance with the refresh rate determined by the determination unit at the period determined by the updating period decision unit.

8. An information processing apparatus equipped with a WideIO memory device stacked on an SOC die including a CPU, comprising:
a temperature obtaining unit configured to obtain temperature information of each of a plurality of memories of the WideIO memory device;
a plurality of functional modules, included in the SOC die, for executing respective functions;
a generation unit configured to generate temperature distribution information of the WideIO memory device in accordance with respective execution of the plurality of functional modules;
a determination unit configured to obtain a maximum temperature of the WideIO memory device based on the temperature distribution information and determining a refresh rate of the WideIO memory device based on the maximum temperature;
an updating period decision unit configured to decide a period, at which the determination unit determines the refresh rate of the WideIO memory device, based on an elapsed time since the determination unit determined the refresh rate of the WideIO memory device, and a difference between a temperature of the WideIO memory device when the elapsed time elapses and a predetermined temperature; and
a memory control unit configured to refresh the WideIO memory device in accordance with the refresh rate determined by the determination unit at the period determined by the updating period decision unit.

9. The information processing apparatus according to claim 1, wherein the updating period decision unit shortens the period when the operation mode of the information processing apparatus is changed, and lengthens the period in accordance with a duration of time in which the information processing apparatus remains in a given operation mode, measured from a time at which the operation mode was changed to the given operation mode.

10. A method of controlling an information processing apparatus equipped with a WideIO memory device stacked on an SOC die including a CPU, comprising:
obtaining temperature information of each of a plurality of memories of the WideIO memory device;

generating temperature distribution information of the WideIO memory device in accordance with respective execution of a plurality of function modules, that each execute respective functions, included in the SOC die;

obtaining a maximum temperature of the WideIO memory device based on the temperature distribution information and determining a refresh rate of the WideIO memory device based on the maximum temperature;

deciding a period, at which the refresh rate of the WideIO memory device is determined in the determining, based on an operation mode of the information processing apparatus and a change rate of the maximum temperature for a predetermined time interval; and refreshing the WideIO memory device in accordance with the refresh rate determined in the determining at the period determined in the deciding.

11. A computer-readable storage medium storing a program for causing a computer to execute a method of controlling an information processing apparatus equipped with a WideIO memory device stacked on an SOC die including a CPU, the method comprising:

obtaining temperature information of each of a plurality of memories of the WideIO memory device;

generating temperature distribution information of the WideIO memory device in accordance with respective execution of a plurality of function modules, that each execute respective functions, included in the SOC die;

obtaining a maximum temperature of the WideIO memory device based on the temperature distribution information and determining a refresh rate of the WideIO memory device based on the maximum temperature;

deciding a period, at which the refresh rate of the WideIO memory device is determined in the determining, based on an operation mode of the information processing apparatus and a change rate of the maximum temperature for a predetermined time interval; and refreshing the WideIO memory device in accordance with the refresh rate determined in the determining at the period determined in the deciding.

* * * * *